(12) United States Patent
Omote et al.

(10) Patent No.: US 10,743,432 B2
(45) Date of Patent: Aug. 11, 2020

(54) ELECTRONIC APPARATUS

(71) Applicants: Kabushiki Kaisha Toshiba, Minato-ku, Tokyo (JP); Toshiba Electronic Devices & Storage Corporation, Minato-ku, Tokyo (JP)

(72) Inventors: Hirofumi Omote, Adachi Tokyo (JP); Hiroshi Ota, Misato Saitama (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/299,437

(22) Filed: Mar. 12, 2019

(65) Prior Publication Data
US 2019/0373750 A1 Dec. 5, 2019

(30) Foreign Application Priority Data
May 31, 2018 (JP) .................. 2018-105618

(51) Int. Cl.
| | |
|---|---|
| *H05K 5/00* | (2006.01) |
| *H05K 5/06* | (2006.01) |
| *H05K 7/14* | (2006.01) |
| *H05K 3/34* | (2006.01) |
| *H05K 3/28* | (2006.01) |

(52) U.S. Cl.
CPC ............ *H05K 5/065* (2013.01); *H05K 3/284* (2013.01); *H05K 3/34* (2013.01); *H05K 7/1427* (2013.01)

(58) Field of Classification Search
CPC .................................................... H05K 7/00
See application file for complete search history.

(56) References Cited

U.S. PATENT DOCUMENTS

| | | | |
|---|---|---|---|
| 8,107,255 B2 | 1/2012 | Sakamoto et al. | |
| 9,474,168 B2 | 10/2016 | Motoori et al. | |
| 2015/0014739 A1* | 1/2015 | Kim | ........... H01L 33/486 257/100 |
| 2015/0043141 A1* | 2/2015 | Pegg | .............. H04M 1/026 361/679.26 |

FOREIGN PATENT DOCUMENTS

| | | |
|---|---|---|
| JP | 2006-288433 A | 10/2006 |
| JP | 4934559 B2 | 5/2012 |
| JP | 2013-243251 A | 12/2013 |
| JP | 2018-019011 A | 2/2018 |

\* cited by examiner

*Primary Examiner* — Jerry Wu
(74) *Attorney, Agent, or Firm* — White & Case LLP

(57) ABSTRACT

According to one embodiment, an electronic apparatus includes a first casing, a second casing, and a sub-assembly. The sub-assembly includes a board, a component, and an integrally molded component. The board is positioned between the first casing and the second casing, and includes a first face, a second face opposite to the first face, and an outer rim between the first face and the second face. The component is mounted at least one of the first face and the second face. The integrally molded component consists essentially of an elastomer, and is in a state integrated with the board while sandwiching the board, and sandwiched between the first casing and the second casing.

6 Claims, 19 Drawing Sheets

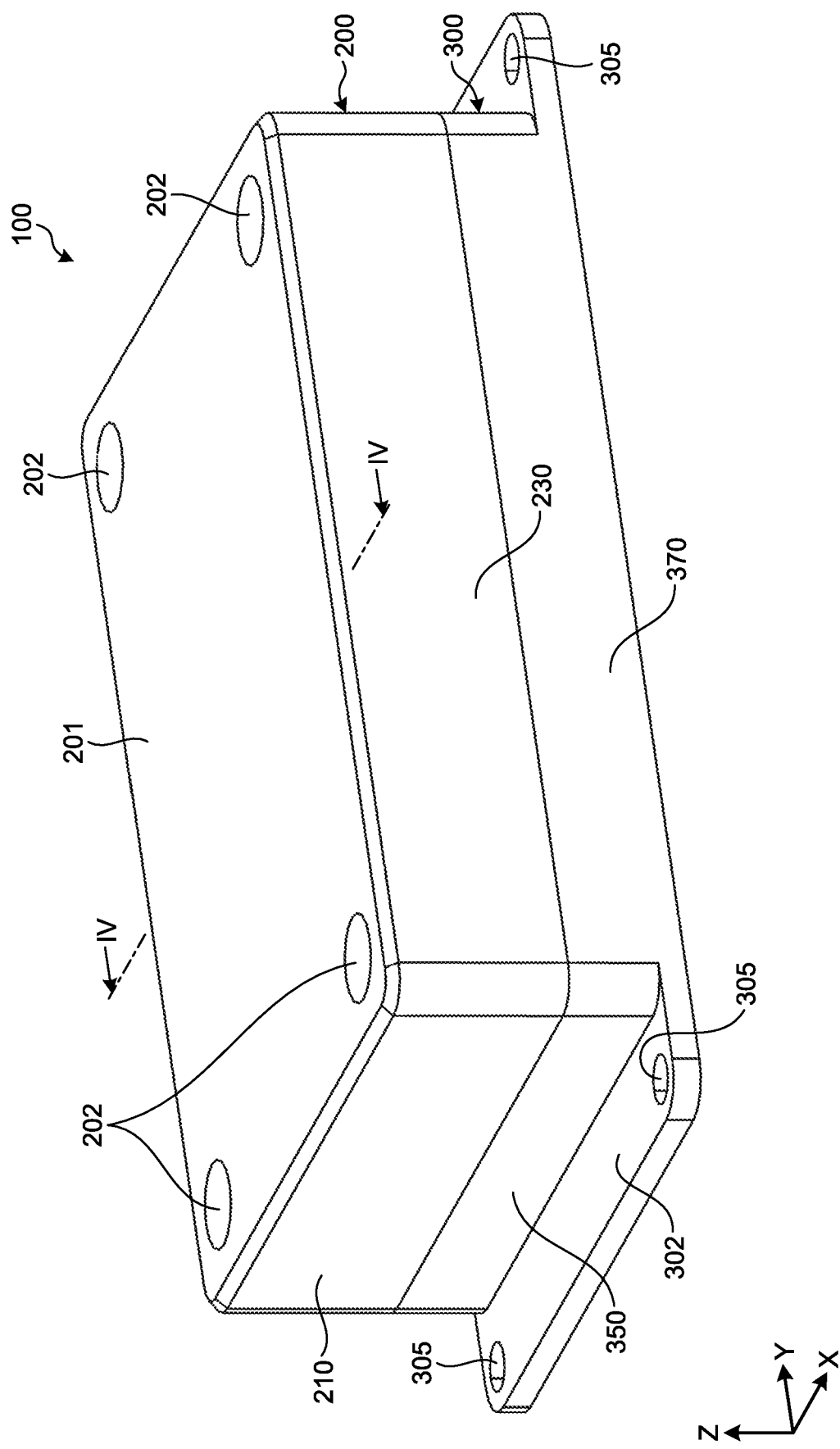

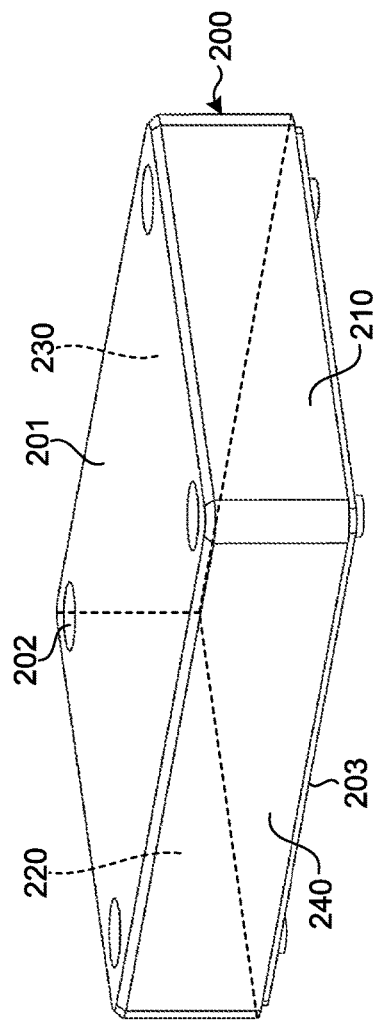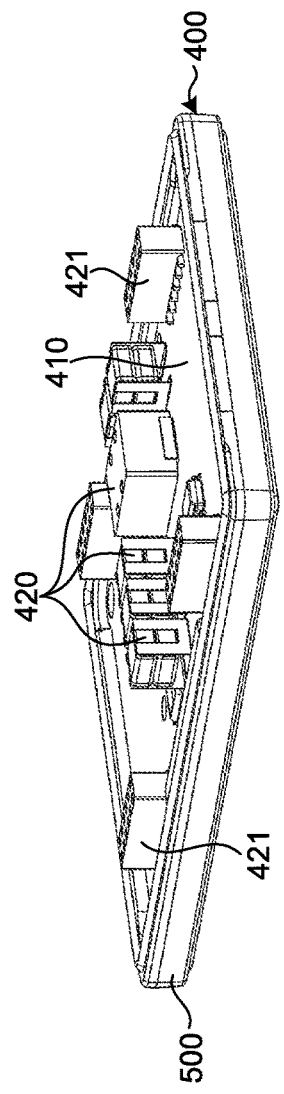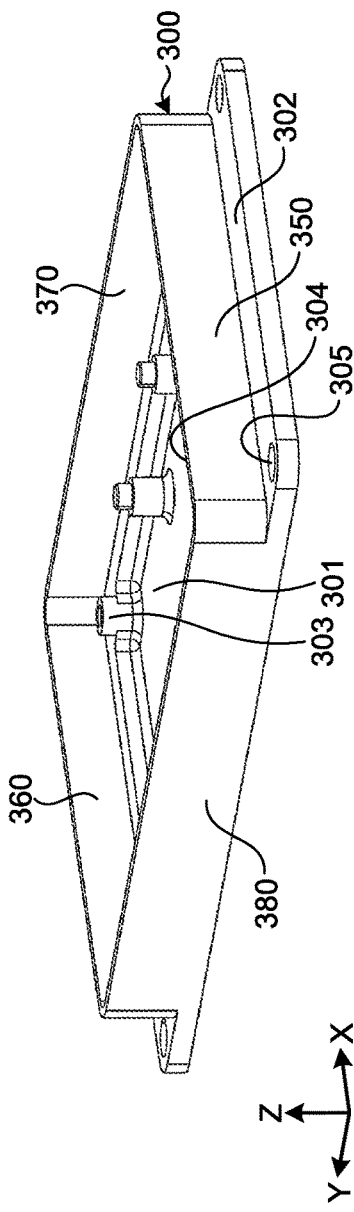
FIG.2A
FIG.2B
FIG.2C

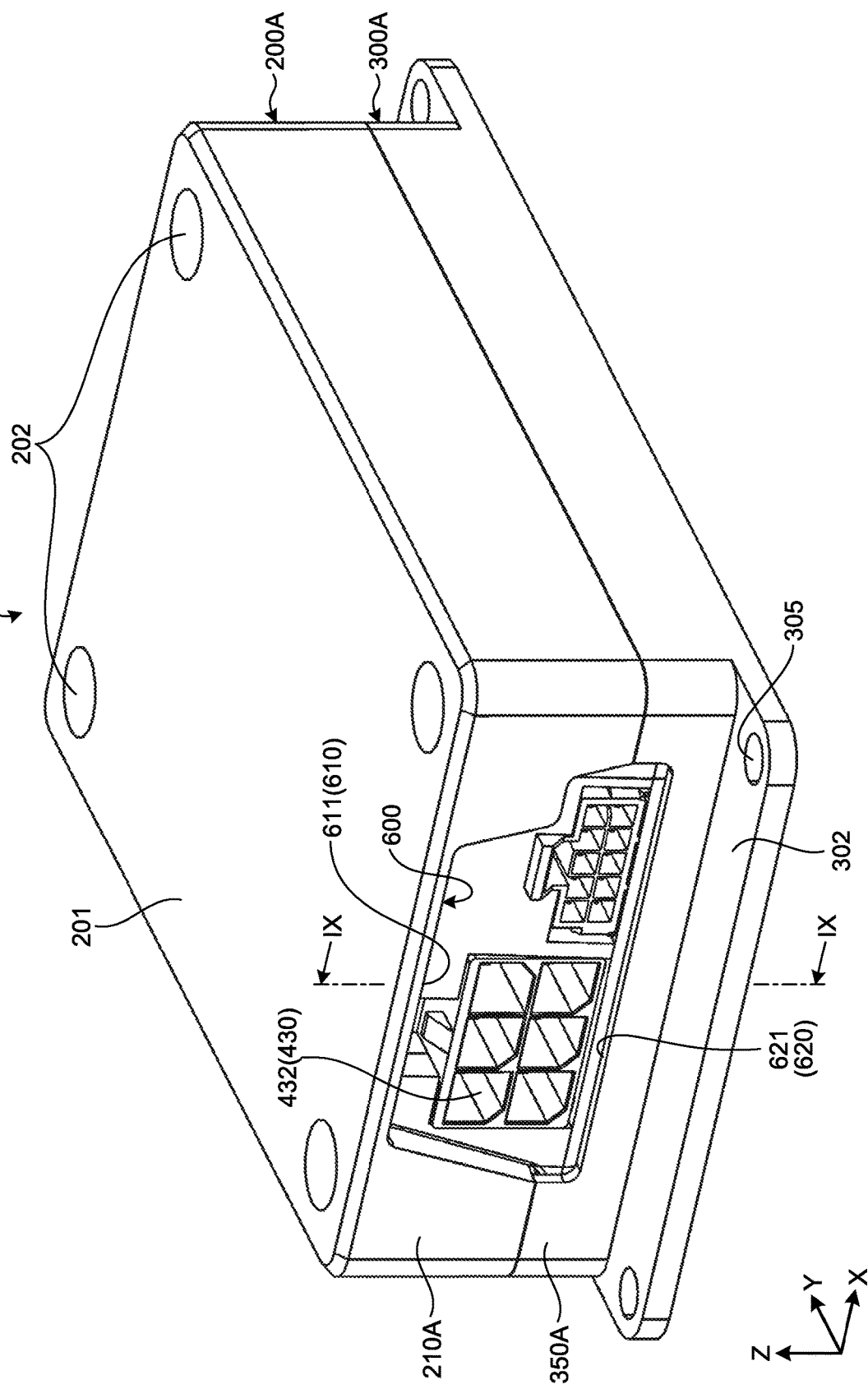

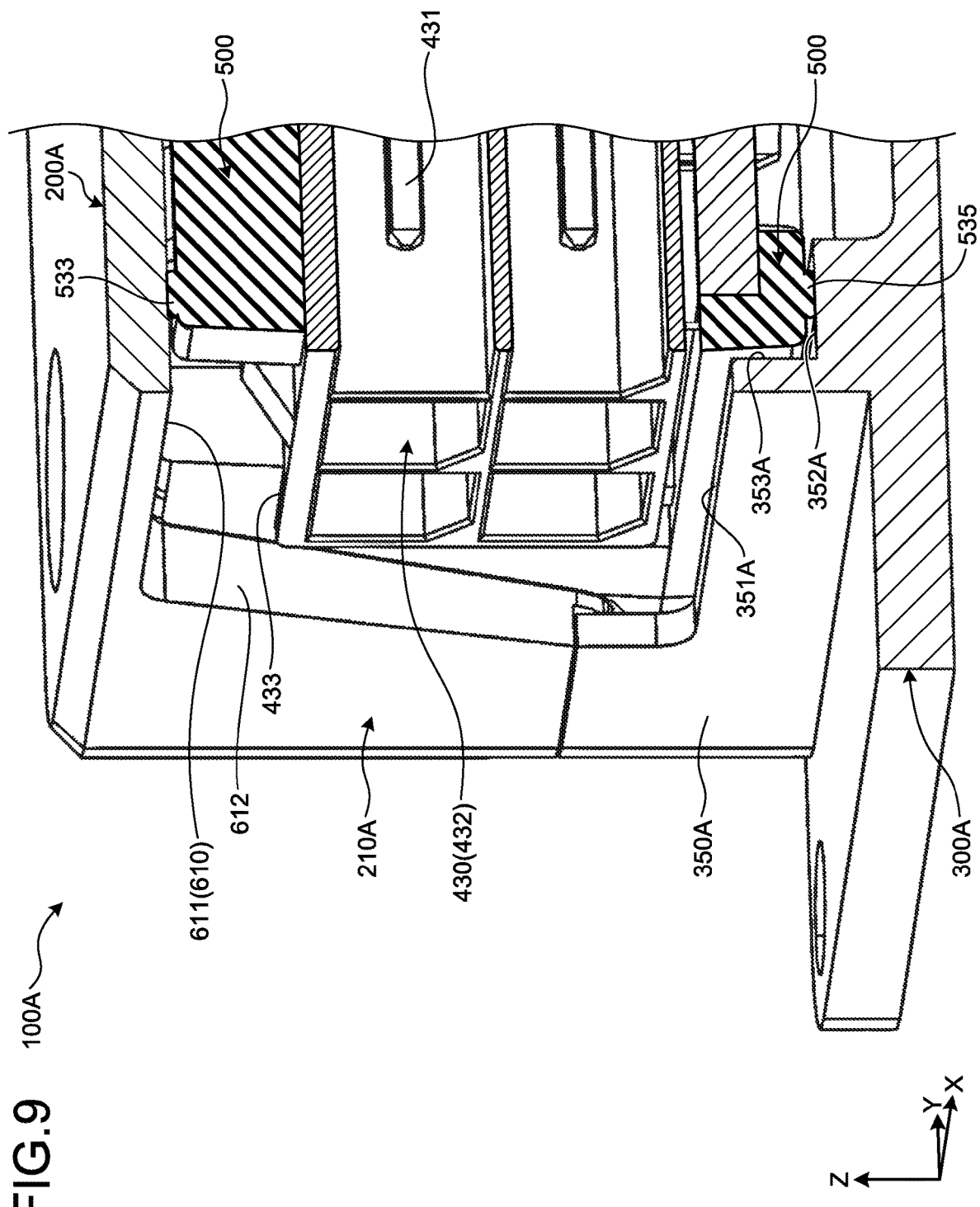

ELECTRONIC APPARATUS

CROSS-REFERENCE TO RELATED APPLICATIONS

This application is based upon and claims the benefit of priority from Japanese Patent Application No. 2018-105618, filed on May 31, 2018; the entire contents of which are incorporated herein by reference.

FIELD

Embodiments described herein relate generally to an electronic apparatus.

BACKGROUND

Conventionally, an electronic apparatus is known in which a housing formed of a first casing and a second casing contains therein a board on which electronic components are mounted. In this electronic apparatus, a seal rubber is sandwiched between the first casing and the second casing to ensure the sealing performance, such as waterproof and dustproof properties, between the first casing and the second casing.

BRIEF DESCRIPTION OF THE DRAWINGS

FIG. 1 is an exemplary and schematic perspective view of an electronic apparatus according to a first embodiment, which is viewed obliquely from above;

FIG. 2A is a partial view of an exemplary and schematic exploded perspective view of the electronic apparatus according to the first embodiment;

FIG. 2B is another partial view of the exemplary and schematic exploded perspective view of the electronic apparatus according to the first embodiment;

FIG. 2C is another partial view of the exemplary and schematic exploded perspective view of the electronic apparatus according to the first embodiment;

FIG. 7 is an exemplary and schematic perspective view of an electronic apparatus according to a second embodiment, which is viewed obliquely from above;

FIG. 9 is an exemplary and schematic sectional view taken along a line IX-IX of FIG. 7;

DETAILED DESCRIPTION

Figure 3:
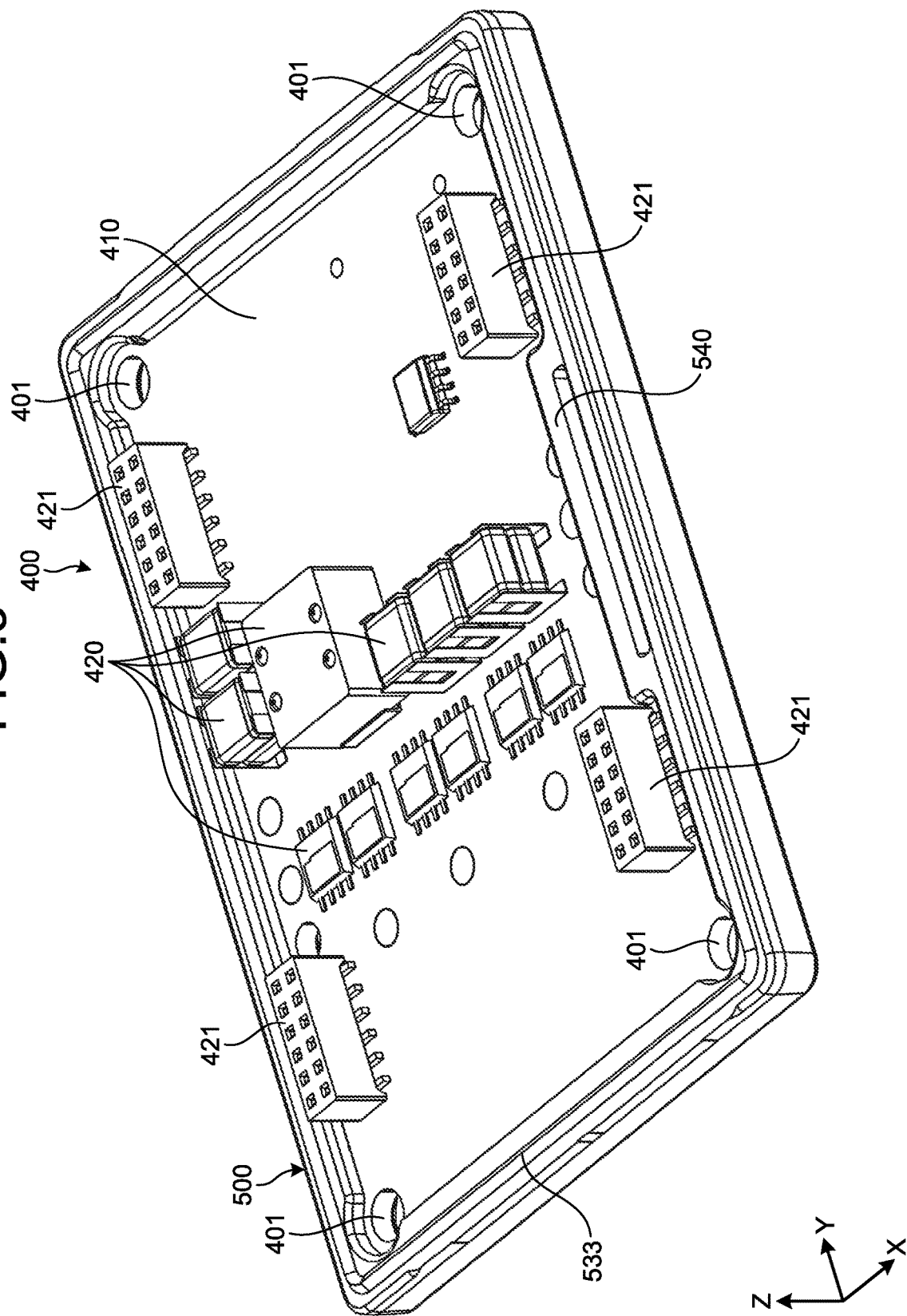
FIG. 3 is an exemplary and schematic perspective view illustrating a sub-assembly in which an integrally molded component is provided on a board, according to the first embodiment.

In general, according to one embodiment, an electronic apparatus includes, for example, a first casing, a second casing, and a sub-assembly. The sub-assembly includes a board, a component, and an integrally molded component. The board is positioned between the first casing and the second casing, and includes a first face, a second face opposite to the first face, and an outer rim between the first face and the second face. The component is mounted at least one of the first face and the second face. The integrally molded component consists essentially of an elastomer, and is in a state integrated with the board while sandwiching the board, and sandwiched between the first casing and the second casing.

Exemplary embodiments of the embodiments will be disclosed hereinafter. The configuration of each of the embodiments described below and the functions and results (effects) obtained by the configuration are mere examples.

Further, a plurality of embodiments disclosed below include constituent elements substantially the same as each other. Accordingly, such constituent elements substantially the same as each other are denoted by common reference symbols, and their repetitive description will be suitably omitted. Further, in each of the drawings referred to below, an X-direction, a Y-direction, and a Z-direction, which are perpendicular to each other, are defined, for the sake of convenience.

First Embodiment

First, an explanation will be given of an electronic apparatus 100 according to a first embodiment.

FIG. 1 is a perspective view of the electronic apparatus 100 according to the first embodiment, which is viewed obliquely from above. FIGS. 2A to 2C are partial views of an exploded perspective view of the electronic apparatus 100 according to the first embodiment.

As illustrated in FIGS. 1 and 2A to 2C, the electronic apparatus 100 according to the first embodiment includes, for example, a first casing 200, a second casing 300, and a sub-assembly 400.

The first casing 200 includes, for example, a top wall portion 201, a first sidewall portion 210, a second sidewall portion 220, a third sidewall portion 230, and a fourth sidewall portion 240. The top wall portion 201 has, for example, a rectangular shape, and is provided with bolt holes 202 arranged at its four corners one by one and extending therethrough in the Z-direction. The first sidewall portion 210 extends backward in the Z-direction from the end edge of the top wall portion 201 on the backward side in the Y-direction. The second sidewall portion 220 extends backward in the Z-direction from the end edge of the top wall portion 201 on the forward side in the Y-direction. The third sidewall portion 230 extends backward in the Z-direction from the end edge of the top wall portion 201 on the forward side in the X-direction. The fourth sidewall portion 240 extends backward in the Z-direction from the end edge of the top wall portion 201 on the backward side in the X-direction.

The second casing 300 includes, for example, a bottom wall portion 301, a fifth sidewall portion 350, a sixth sidewall portion 360, a seventh sidewall portion 370, an eighth sidewall portion 380, and flange portions 302. The bottom wall portion 301 has, for example, a rectangular shape, and is provided with fastening pedestals 303 arranged at its four corners one by one, specifically at positions corresponding to the bolt holes of the first casing 200. Each of the fastening pedestals 303 includes a female screw for engaging with the male screw of a bolt (not illustrated). The fifth sidewall portion 350 extends forward in the Z-direction from the end edge of the bottom wall portion 301 on the backward side in the Y-direction. The sixth sidewall portion 360 extends forward in the Z-direction from the end edge of the bottom wall portion 301 on the forward side in the Y-direction. The seventh sidewall portion 370 extends forward in the Z-direction from the end edge of the bottom wall portion 301 on the forward side in the X-direction. The eighth sidewall portion 380 extends forward in the Z-direction from the end edge of the bottom wall portion 301 on the backward side in the X-direction. The flange portions 302 are arranged on the backward side in the Y-direction of the fifth sidewall portion 350, and on the forward side in the Y-direction of the sixth sidewall portion 360. Each of the flange portions 302 is provided with bolt insertion holes 305 extending therethrough in the Z-direction. A mounting counterpart member (not illustrated), to which the electronic apparatus 100 is to be secured, is provided with, for example, female screw holes at positions corresponding to the bolt insertion holes 305. Accordingly, while the bolt insertion holes 305 of the flange portions 302 are aligned with the female screw holes of the mounting counterpart member, the electronic apparatus 100 is placed on the mounting counterpart member. In this state, bolts are inserted into the bolt insertion holes 305, and are fastened to the female screw holes of the mounting counterpart member, so that the electronic apparatus 100 is secured to the mounting counterpart member.

Further, as illustrated in FIGS. 2A to 2C, in the first casing 200, the lower end 203 of the first sidewall portion 210 to the fourth sidewall portion 240 has a rectangular loop shape. Further, in the second casing 300, the upper end 304 of the fifth sidewall portion 350 to the eighth sidewall portion 380 has a rectangular loop shape extending along the lower end 203 of the first casing 200. Here, as the material of the first casing 200 and the second casing 300, for example, a metal, such as aluminum alloy, is used. The aluminum alloy has such properties that are high in strength even with light weight and high in heat dissipation.

Figure 4:
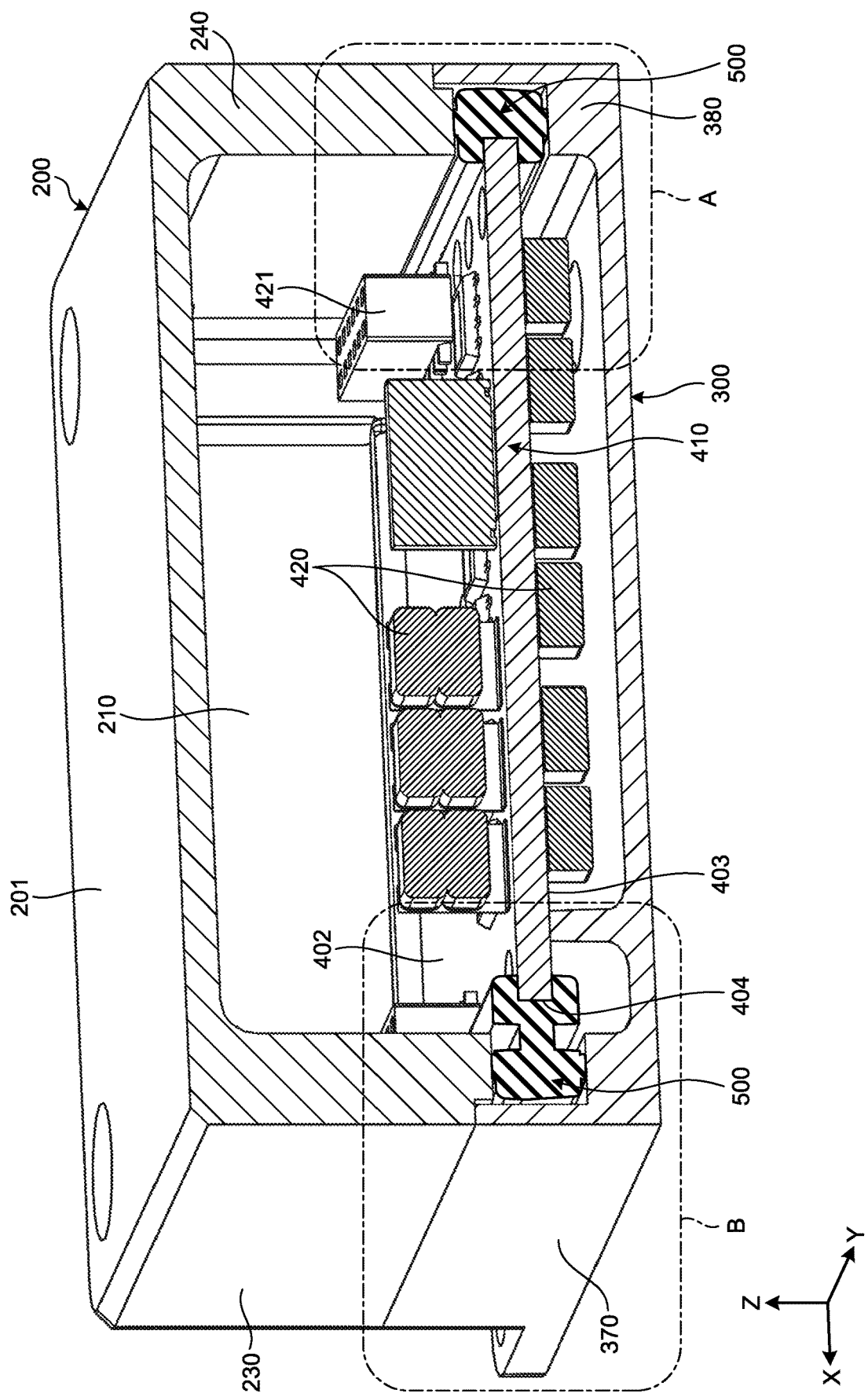
FIG. 4 is an exemplary and schematic sectional view taken along a line IV-IV of FIG. 1.
Figure 5:
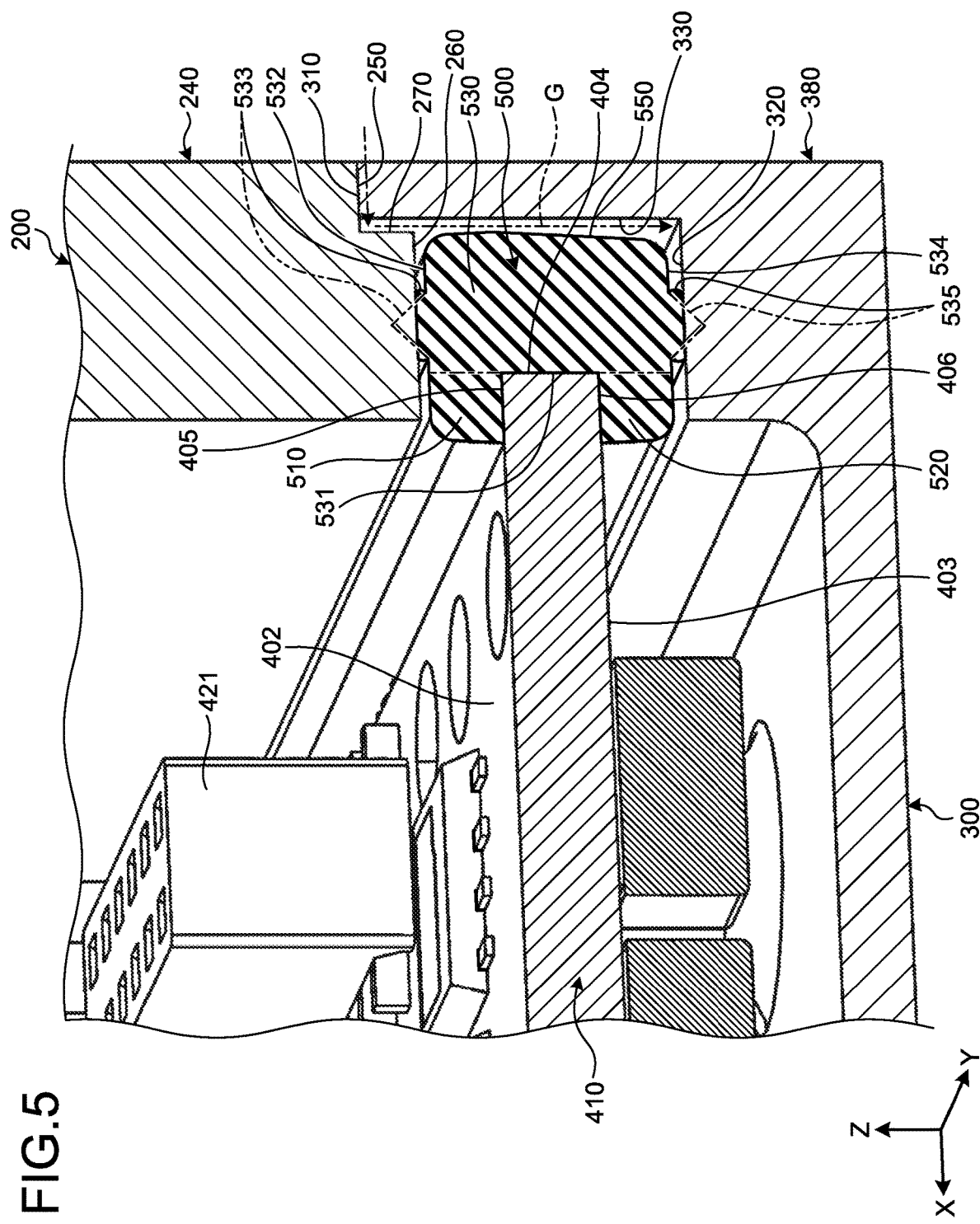
FIG. 5 is an exemplary and schematic sectional view enlarging a place A of FIG. 4.
Figure 6:
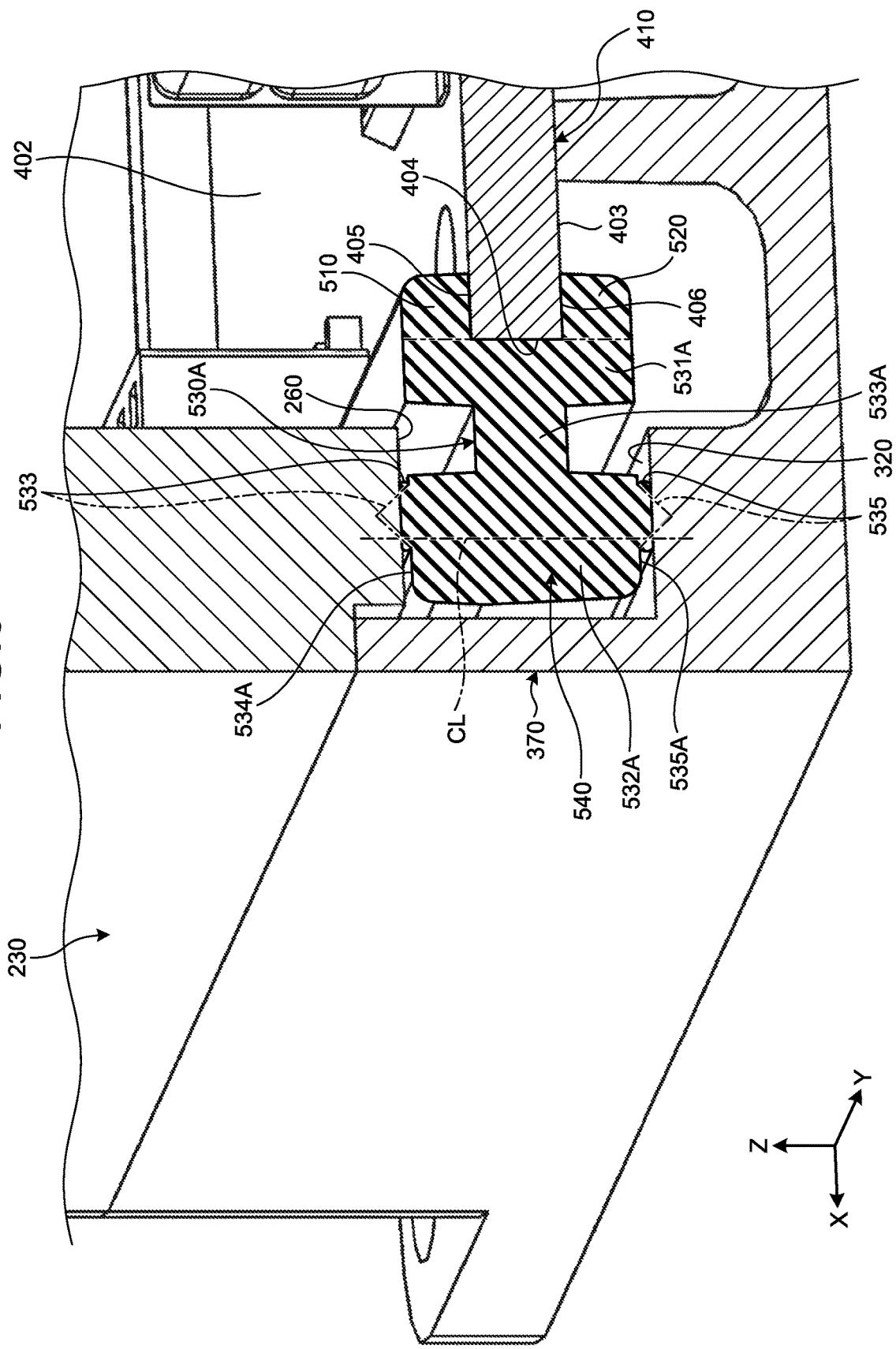
FIG. 6 is an exemplary and schematic sectional view enlarging a place B of FIG. 4.

FIG. 3 is a perspective view illustrating a sub-assembly 400 in which an integrally molded component 500 is provided on a board 410, according to the first embodiment. FIG. 4 is a sectional view taken along a line IV-IV of FIG. 1. FIG. 5 is a sectional view enlarging a place A of FIG. 4. FIG. 6 is a sectional view enlarging a place B of FIG. 4.

The sub-assembly 400 includes the board 410, components, such as electronic components 420 and connectors 421, and an integrally molded component 500.

As illustrated in FIGS. 2A to 2C and 3, the board 410 is positioned between the first casing 200 and the second casing 300 in the Z-direction, and is formed in a rectangular shape when viewed in the Z-direction (in a plan view). The board 410 is provided with bolt insertion holes 401 arranged at its four corners one by one and extending therethrough in the Z-direction. Further, as illustrated in FIG. 4, the board 410 includes a first face 402 on the forward side in the Z-direction, a second face 403 on the backward side in the Z-direction, and an outer rim 404 around the first face 402 and the second face 403. In other words, the second face 403 is positioned opposite to the first face 402. The outer rim 404 may be also referred to as "end face".

As illustrated in FIGS. 2A to 2C, 3, and 4, a plurality of electronic components 420 and connectors 421 are mounted on the first face 402 and the second face 403 of the board 410. The electronic components 420 are, for example, semiconductor devices and passive devices, and are mounted on the board 410 by, for example, solder in this embodiment. Here, each of the electronic components 420 and the connectors 421 is an example of a component.

The integrally molded component 500 is integrally provided by, for example, insert molding at the peripheral edge portion of the board 410. In other word, the integrally molded component 500 is a component integrally molded with the board 410. The integrally molded component 500 is made of an elastomer. Here, when the integrally molded component 500 is to be provided by injection molding to the board 410 with the electronic components 420 and so forth mounted thereon, low temperature and low pressure conditions are preferably used. In this injection molding, the board 410 with the electronic components 420 and so forth mounted thereon is set in a mold, and the elastomer in a heated and melted state is poured into the mold. Then, the elastomer is cooled and solidified, so that the integrally molded component 500 is provided by insert molding on the peripheral edge portion of the board 410. Accordingly, as the elastomer, for example, urethane rubber or silicone rubber is preferably used. The urethane rubber has chemical-resistant and oil-resistant properties in addition to a waterproof property. The melting temperature of the elastomer is lower than the melting temperature of the solder that electrically and mechanically connects the electronic components 420 to the board 410. Here, as illustrated in FIGS. 2A to 2C, the integrally molded component 500 has a rectangular loop shape extending along the lower end 203 of the first casing 200 and the upper end 304 of the second casing 300.

As illustrated in FIG. 5, the lower face of the fourth sidewall portion 240 of the first casing 200 includes an outer perimeter area 250 positioned on the outer peripheral side, an inner perimeter area 260 (first perimeter area) positioned on the inner peripheral side of the outer perimeter area 250, and an interconnecting surface 270 interconnecting the outer perimeter area 250 and the inner perimeter area 260 to each other. The outer perimeter area 250 is positioned on the forward side in the Z-direction relative to the inner perimeter area 260. Accordingly, the inner perimeter area 260, the interconnecting surface 270, and the outer perimeter area 250 have a stepwise shape. Further, as described above, the lower end 203 of the first casing 200 has a loop shape, and thus also the inner perimeter area 260 has a loop shape. Here, the inner perimeter area 260 is an example of the first perimeter area.

The upper face of the eighth sidewall portion 380 of the second casing 300 includes an outer perimeter area 310 positioned on the outer peripheral side, an inner perimeter area 320 (second perimeter area) positioned on the inner peripheral side of the outer perimeter area 310, and an interconnecting surface 330 interconnecting the outer perimeter area 310 and the inner perimeter area 320 to each other. The outer perimeter area 310 is positioned on the forward side in the Z-direction relative to the inner perimeter area 320. Accordingly, the outer perimeter area 310, the interconnecting surface 330, and the inner perimeter area 320 have a stepwise shape. Here, the outer perimeter area 250 of the first casing 200 extends along the outer perimeter area 310 of the second casing 300, and the outer perimeter area 250 of the first casing 200 is in a state in contact with the outer perimeter area 310 of the second casing 300. Further, a gap G extending in the Z-direction is provided between the interconnecting surface 330 of the second casing 300, and the interconnecting surface 270 of the first casing 200 and the lateral surface 550 of the integrally molded component 500. Here, as described above, the upper end 304 of the second casing 300 has a loop shape, and thus also the inner perimeter area 320 (second perimeter area) of the second casing 300 has a loop shape extending along the inner perimeter area 260 (first perimeter area) of the first casing 200.

The integrally molded component 500 includes a first part 510, a second part 520, and a third part 530.

The first part 510 is one of the inner peripheral side parts, which is positioned on the forward side in the Z-direction, of the integrally molded component 500, and is in contact with an end portion 405 of the first face 402 of the board 410. The second part 520 is the other of the inner peripheral side parts, which is positioned on the backward side in the Z-direction, of the integrally molded component 500, and is in contact with an end portion 406 of the second face 403 of the board 410. The third part 530 is positioned as an outer peripheral side part of the integrally molded component 500, and connects the first part 510 and second part 520 to each other. The third part 530 includes an inner peripheral surface 531 in contact with the outer rim 404 of the board 410. The first part 510, the second part 520, and the third part 530 are integrally formed in a U-shape in section. In this way, the first part 510 and the second part 520 are integrated with the board 410 while sandwiching the board 410. Further, as the integrally molded component 500 has a rectangular loop shape extending along the lower end 203 of the first casing 200 and the upper end 304 of the second casing 300, also the third part 530 has a loop shape extending along the inner perimeter area 260 (first perimeter area) of the first casing 200.

Further, the third part 530 includes a first protruding portion 533 protruding forward in the Z-direction (upward) on its upper surface 532. The first protruding portion 533 is formed to have a triangular shape in section in a free state illustrated by a two-dot chain line. When being pressed by the inner perimeter area 260 of the first casing 200, the first protruding portion 533 is collapsed by elastic deformation in the Z-direction, in a compressed state illustrated by a solid line. Further, the third part 530 includes a second protruding portion 535 protruding backward in the Z-direction (downward) on its lower surface 534. The second protruding portion 535 is formed to have a triangular shape in section in a free state illustrated by a two-dot chain line. When being pressed by the inner perimeter area 320 of the second casing 300, the second protruding portion 535 is collapsed by elastic deformation in the Z-direction, as illustrated by a solid line. In this way, the first protruding portion 533 has a loop shape extending along the inner perimeter area 260 (first perimeter area) of the first casing 200, and provides a contact region and a seal region with respect to the inner perimeter area 260. The second protruding portion 535 has a loop shape extending along the inner perimeter area 320 (second perimeter area) of the second casing 300, and provides a contact region and a seal region with respect to the inner perimeter area 320. Further, the third part 530 including the first protruding portion 533 and the second protruding portion 535 is sandwiched between the inner perimeter area 260 (first perimeter area) of the first casing 200 and the inner perimeter area 320 (second perimeter area) of the second casing 300 in the Z-direction over the entire circumference.

As illustrated in FIG. 6, at another position of the integrally molded component 500, the third part 530A has an H-shape in section. Specifically, as illustrated in FIG. 3, the integrally molded component 500 is partly provided with a protruding portion 540, which protrudes to the inner peripheral side and extends in the Y-direction. FIG. 6 illustrates a sectional view of this protruding portion 540. Next, a specific explanation will be given.

The first part 510 is one of the inner peripheral side parts, which is positioned on the forward side in the Z-direction, of the integrally molded component 500, and is in contact with the end portion 405 of the first face 402 of the board 410. The second part 520 is the other of the inner peripheral side parts, which is positioned on the backward side in the Z-direction, of the integrally molded component 500, and is in contact with the end portion 406 of the second face 403 of the board 410. The third part 530A is positioned as an outer peripheral side part of the integrally molded component 500, which has an H-shape in section. Specifically, the third part 530A includes an inner peripheral portion 531A, an outer peripheral portion 532A, and an interconnecting portion 533A. The inner peripheral portion 531A is a part rectangular in section, which is adjacent to the outer peripheral side of the first part 510 and the second part 520 and extends in the Z-direction. The outer peripheral portion 532A is a part rectangular in section, which is positioned with a space in the X-direction from the inner peripheral portion 531A and extends in the Z-direction. The interconnecting portion 533A extends in the X-direction and interconnects the inner peripheral portion 531A and the outer peripheral portion 532A to each other. The thickness of the interconnecting portion 533A in the Z-direction is set smaller than the thickness of the inner peripheral portion 531A and the thickness of the outer peripheral portion 532A.

The outer peripheral portion 532A includes the first protruding portion 533 protruding forward in the Z-direction (upward) on its upper surface 534A. The first protruding portion 533 is pressed by the inner perimeter area 260 of the first casing 200. The outer peripheral portion 532A includes the second protruding portion 535 protruding backward in the Z-direction (downward) on its lower surface 535A. The second protruding portion 535 is pressed by the inner perimeter area 320 of the second casing 300. Here, the center line CL extending in the Z-direction through the center of the outer peripheral portion 532A in the X-direction is indicated by a one-dot chain line. The first protruding portion 533 and the second protruding portion 535 are positioned on the inner peripheral side (the backward side in the X-direction) relative to the center line CL. Accordingly, for example, there is a case where the inner perimeter area 260 of the first casing 200 and the inner perimeter area 320 of the second casing 300 become surfaces intersecting obliquely with a plane perpendicular to the Z-direction, and the center line CL of the outer peripheral portion 532A pressed by the inner perimeter areas 260 and 320 may come to intersect obliquely with the Z-direction. In this way, when the extension direction of the outer peripheral portion 532A in the Z-direction becomes different from the extension direction of the inner peripheral portion 531A in the Z-direction, the interconnecting portion 533A is elastically deformed to prevent an excessive load from being transmitted to the inner peripheral portion 531A. Here, FIGS. 4 to 6 illustrate a section of the integrally molded component 500 by using rubber hatching, but the material of the integrally molded component 500 is not limited to rubber.

As described above, the electronic apparatus 100 according to this embodiment is provided with, for example, the sub-assembly 400 including the board 410 and the integrally molded component 500. The board 410 includes the first face 402 and the second face 403 opposite to the first face 402. The integrally molded component 500 is made of an elastomer, and is in a state integrated with the board 410 while sandwiching the board 410, and sandwiched between the first casing 200 and the second casing 300.

As the integrally molded component 500 is integrated with the board 410, for example, the electronic apparatus 100 can be smaller in the number of components and improved in the assembling workability, as compared with a conventional case where the seal rubber and the board are separate from each other. Further, as the integrally molded component 500 is integrated with the board 410 by, for example, injection molding, the integrally molded component 500 can be more easily formed.

Further, the integrally molded component 500 includes, for example, the first part 510 in contact with the first face 402, the second part 520 in contact with the second face 403, and the third part 530 connecting the first part 510 and the second part 520 to each other. The integrally molded component 500 is integrated with the board 410 in a state where the first part 510 and the second part 520 sandwich the board 410.

Accordingly, the third part 530 covers the outer rim 404 of the board 410, and thereby, for example, makes it more easily possible to restrict infiltration of water from the outer rim 404 of the board 410. Here, in the board 410, water can infiltrate from the outer rim 404 more easily than from the first face 402 and the second face 403, and thus it is effective to cover the outer rim 404. Further, as the first part 510 and the second part 520 are sandwiched between the first casing 200 and the second casing 300, vibration of the board 410 is efficiently suppressed.

Further, for example, the first casing 200 includes the inner perimeter area 260 (first perimeter area) having a loop shape, and the second casing 300 includes the inner perimeter area 320 (second perimeter area) having a loop shape extending along the inner perimeter area 260. The third part 530 has a loop shape extending along the inner perimeter area 260, and is sandwiched between the inner perimeter area 260 and the inner perimeter area 320 over the entire circumference of this loop shape.

Accordingly, the portion between the first casing 200 and the second casing 300 is sealed by the integrally molded component 500 over the entire circumference of the first casing 200 and the second casing 300. Thus, for example, the sealing performance therebetween, such as waterproof and dustproof properties, is improved more.

Further, for example, the integrally molded component 500 includes the first protruding portion 533 that has a loop shape extending along the inner perimeter area 260, and provides a contact region and a seal region with respect to the inner perimeter area 260. Further, the integrally molded component 500 includes the second protruding portion 535 that has a loop shape extending along the inner perimeter area 320, and provides a contact region and a seal region with respect to the inner perimeter area 320.

As the first protruding portion 533 and the second protruding portion 535 are provided as described above, for example, the sealing performance between the first casing 200 and the second casing 300 is improved more, and vibration of the board 410 is more efficiently suppressed.

Further, the electronic components 420 is mounted on the board 410 by, for example, solder, and the melting temperature of the elastomer is lower than the melting temperature of the solder.

When the integrally molded component 500 made of the elastomer is to be provided by injection molding to the board 410 with electronic components 420 mounted thereon, for example, the elastomer melted in a state covering the first face 402 and the second face 403 of the board 410 is cooled and solidified. Here, as the melting temperature of the elastomer is lower than the melting temperature of the solder, the solder is not melted at a temperature with which the elastomer is thermally melted. Accordingly, the solder used for mounting the electronic components 420 is prevented from being melted during the injection molding. Thus, the generation of quality defects is reduced at the time when the integrally molded component 500 is provided by injection molding to the board 410 with electronic components 420 mounted thereon by the solder.

Here, the board 410 is not directly supported by the first casing 200 and the second casing 300, but is supported by the first casing 200 and the second casing 300 through the integrally molded component 500, which is an elastic member. Accordingly, for example, as compared with a case where the board 410 is directly supported by the first casing 200 and the second casing 300, the sub-assembly 400 is improved in the impact absorption and/or vibration suppression.

Further, as described above with reference to FIG. 6, the third part 530A includes the inner peripheral portion 531A, the outer peripheral portion 532A, and the interconnecting portion 533A. Accordingly, for example, by adjusting specifications, such as thickness and/or length, of the interconnecting portion 533A, it is possible to suitably adjust the impact absorption and/or vibration mode of the sub-assembly 400 in accordance with a specification, such as mass, of the sub-assembly 400.

Second Embodiment

Next, an explanation will be given of an electronic apparatus 100A according to a second embodiment.

Figure 8A:
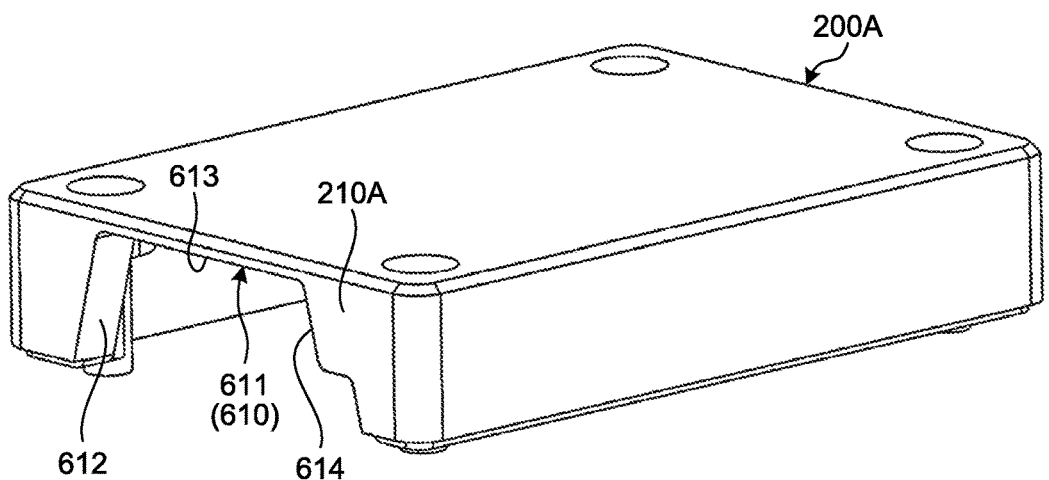
FIG. 8A is a partial view of an exemplary and schematic exploded perspective view of an electronic apparatus according to the second embodiment.
Figure 8B:
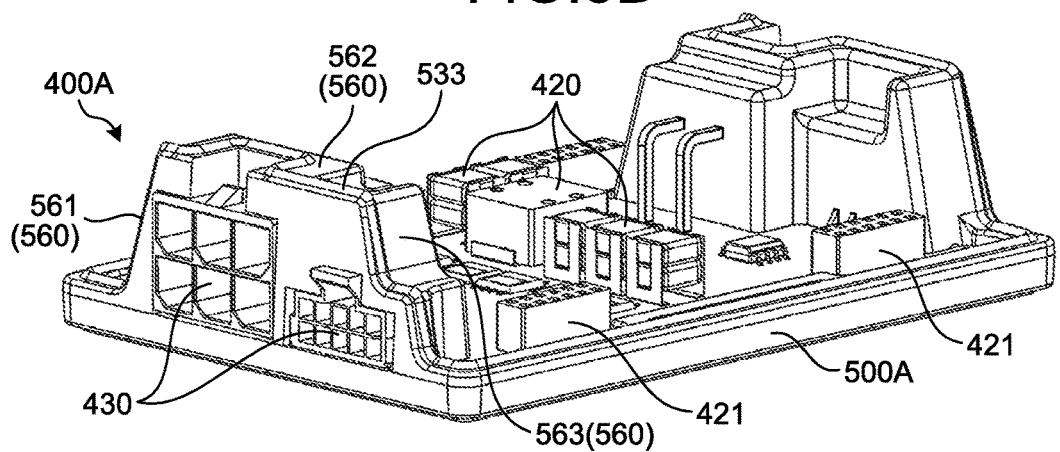
FIG. 8B is another partial view of the exemplary and schematic exploded perspective view of the electronic apparatus according to the second embodiment.
Figure 8C:
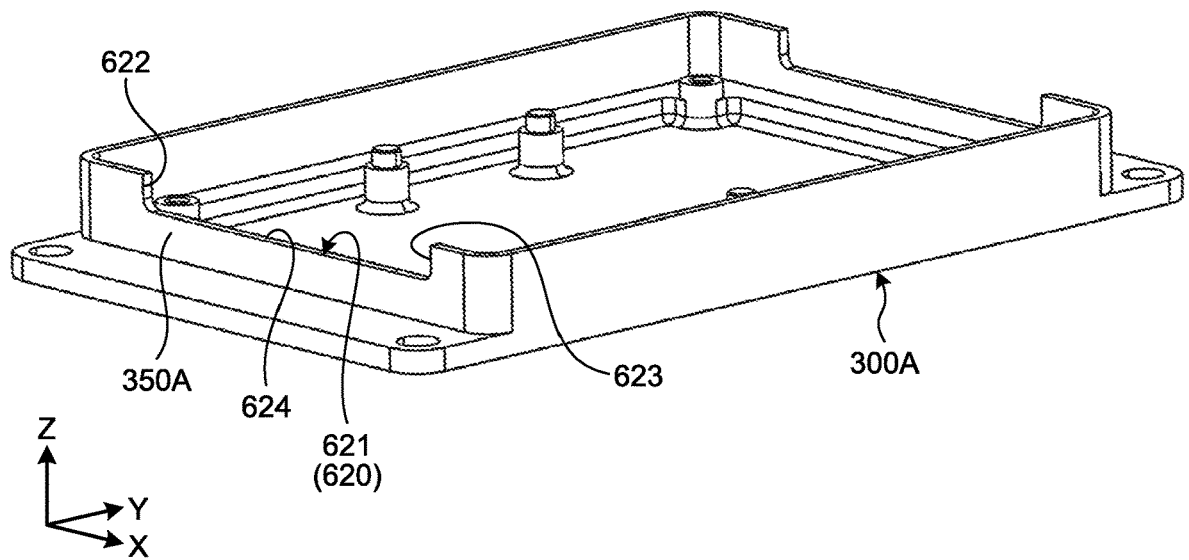
FIG. 8C is another partial view of the exemplary and schematic exploded perspective view of the electronic apparatus according to the second embodiment.
Figure 10:
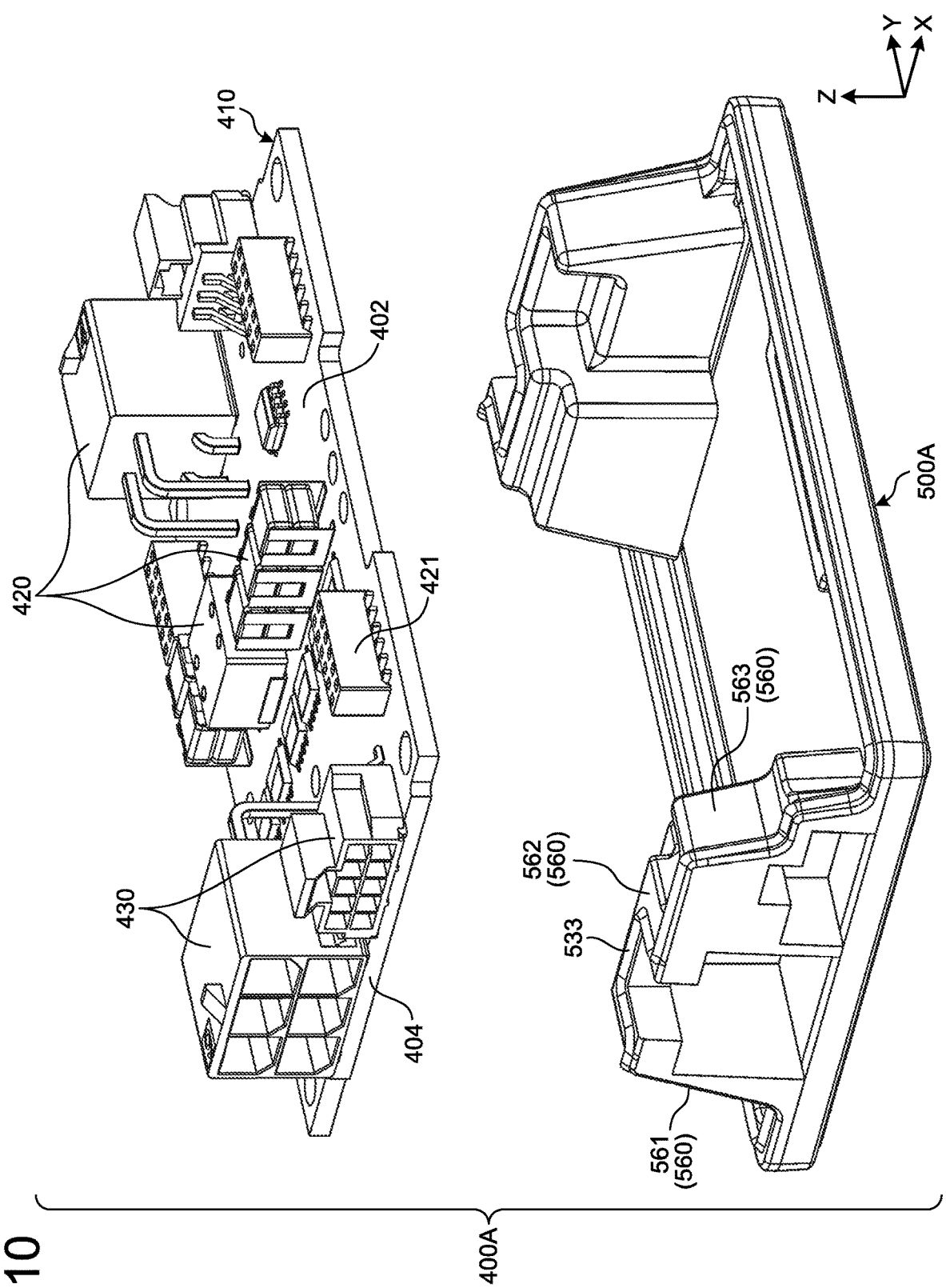
FIG. 10 is an exemplary and schematic exploded perspective view of a board and an integrally molded component, which are illustrated in FIG. 9.

FIG. 7 is a perspective view of the electronic apparatus 100A according to the second embodiment, which is viewed obliquely from above. FIGS. 8A to 8C are partial views of an exploded perspective view of the electronic apparatus 100A according to the second embodiment. FIG. 9 is a sectional view taken along a line IX-IX of FIG. 7. FIG. 10 is an exploded perspective view of a board 410 and an integrally molded component 500A, which are illustrated in FIG. 9.

As illustrated in FIGS. 7 and 8A to 8C, the electronic apparatus 100A according to this embodiment includes, for example, a first casing 200A, a second casing 300A, and a sub-assembly 400A.

The sidewall of the electronic apparatus 100A on the backward side in the Y-direction is provided with a first opening 600. Specifically, the first opening 600 is formed by combining, for example, an upper opening 610 provided in a first sidewall portion 210A of the first casing 200A with a lower opening 620 provided in a fifth sidewall portion 350A of the second casing 300A. As illustrated in FIGS. 8A to 8C, the edge 611 of the upper opening 610 includes, for example, a first inclined portion 612, a horizontal portion 613, and a second inclined portion 614. The first inclined portion 612 is positioned on the backward side in the X-direction, and extends obliquely forward in the X-direction while shifting forward in the Z-direction. The second inclined portion 614 is positioned on the forward side in the X-direction, and extends obliquely backward in the X-direction while shifting forward in the Z-direction. The horizontal portion 613 extends in the X-direction, and interconnects to each other the end portion of the first inclined portion 612 on the forward side in the Z-direction and the end portion of the second inclined portion 614 on the forward side in the Z-direction. The edge 621 of the lower opening 620 includes, for example, two vertical portions 622 and 623 and a horizontal portion 624. The vertical portions 622 and 623 are positioned on the backward side and forward side in the X-direction, respectively, and extend in the Z-direction. The horizontal portion 624 extends in the X-direction, and interconnects to each other the end portions of the two vertical portions 622 and 623 on the backward side in the Z-direction.

As illustrated in FIG. 10, the sub-assembly 400A includes, for example, a board 410, an integrally molded component 500A, and electronic components 420 and first external connection connectors 430 mounted on a first face 402 of the board 410. The first external connection connectors 430 are provided on the end portion of the first face 402 of the board 410 on the backward side in the Y-direction. Each of the first external connection connectors 430 includes terminals 431 (see FIG. 9) each electrically connectable to the terminal of an electric component (not illustrated). The integrally molded component 500A has a loop shape extending along, for example, the peripheral edge portion of the board 410, and is configured to cover the first external connection connectors 430. Specifically, the first external connection connectors 430 are covered by the integrally molded component 500A in a state in contact with the integrally molded component 500A, on the forward side in the X-direction, on the backward side in the X-direction, on the forward side in the Y-direction, on the forward side in the Z-direction, and on the backward side in the Z-direction. However, the first external connection connectors 430 are exposed on the backward side in the Y-direction. Thus, as illustrated in FIG. 7, in a state where the sub-assembly 400A is assembled with the first casing 200A and the second casing 300A, the face of each of the first external connection connectors 430 on the backward side in the Y-direction is exposed outside the first casing 200A and the second casing 300A from the first opening 600. Here, each of the first external connection connectors 430 is an example of an externally exposed member. Further, the externally exposed member may be an exposed member, such as a lamp or switch, other than the external connection connectors.

Further, as illustrated in FIGS. 8A to 8C, in the integrally molded component 500A, the upper side of a part covering the first external connection connectors 430 includes, for example, a third inclined portion 561, a horizontal portion 562, and a fourth inclined portion 563. The third inclined portion 561 has a shape extending along the first inclined portion 612, and extends obliquely forward in the X-direction while shifting forward in the Z-direction. The fourth inclined portion 563 has a shape extending along the second inclined portion 614, and extends obliquely backward in the X-direction while shifting forward in the Z-direction. The horizontal portion 562 has a shape extending along the horizontal portion 613 of the upper opening 610. The third inclined portion 561, the horizontal portion 562, and the fourth inclined portion 563 are connected to and provided with a first protruding portion 533 protruding forward in the Z-direction. The first protruding portion 533 is configured to come into contact with the edge 611 of the upper opening 610 of the first casing 200A.

Further, as illustrated in FIG. 9, each of the first external connection connectors 430 has a configuration in which a plurality of terminals 431 extend through respective shells 432 (casing) made of a synthetic resin. As the terminals 431 and the shells have been processed by insert molding, each of the first external connection connectors 430 is provided with its necessary waterproof property. Here, the integrally molded component 500A is sandwiched between, for example, the edge 611 of the upper opening 610 of the first casing 200A and the upper surfaces 433 of the first external connection connectors 430. Further, the upper face of the fifth sidewall portion 350A of the second casing 300A includes an outer perimeter area 351A positioned on the outer peripheral side, an inner perimeter area 352A positioned on the inner peripheral side of the outer perimeter area 351A, and an interconnecting surface 353A interconnecting the outer perimeter area 351A and the inner perimeter area 352A to each other. The outer perimeter area 351A corresponds to the edge 621 of the lower opening 620 described above. Here, the third inclined portion 561, the horizontal portion 562, and the fourth inclined portion 563 of the integrally molded component 500A are an example of an interposing part 560.

As described above, the electronic apparatus 100A according to this embodiment includes, for example, the first external connection connectors 430. The integrally molded component 500A is provided with the first opening 600 through which the first external connection connectors 430 are exposed outside the first casing 200 and the second casing 300. The integrally molded component 500A includes the interposing part 560 sandwiched between the edge 611 of the first opening 600 and the first external connection connectors 430.

Accordingly, for example, the terminal of an electric component can be electrically connected to one of the terminals 431 of the first external connection connectors 430 from outside the electronic apparatus 100A. Further, even though the first external connection connectors 430 are exposed outside the first casing 200 and the second casing 300, the interposing part 560 serves to ensure the sealing performance for the first external connection connectors 430 with respect to the first casing 200 and the second casing 300. Here, the first inclined portion 612 and the third inclined portion 561 extend obliquely in the Z-direction and the second inclined portion 614 and the fourth inclined portion 563 extend obliquely in the Z-direction. Accordingly, as compared with a case where these portions extend in the Z-direction, the sealing performance thereby obtained becomes higher.

Third Embodiment

Next, an explanation will be given of an electronic apparatus 100B according to a third embodiment.

Figure 11:
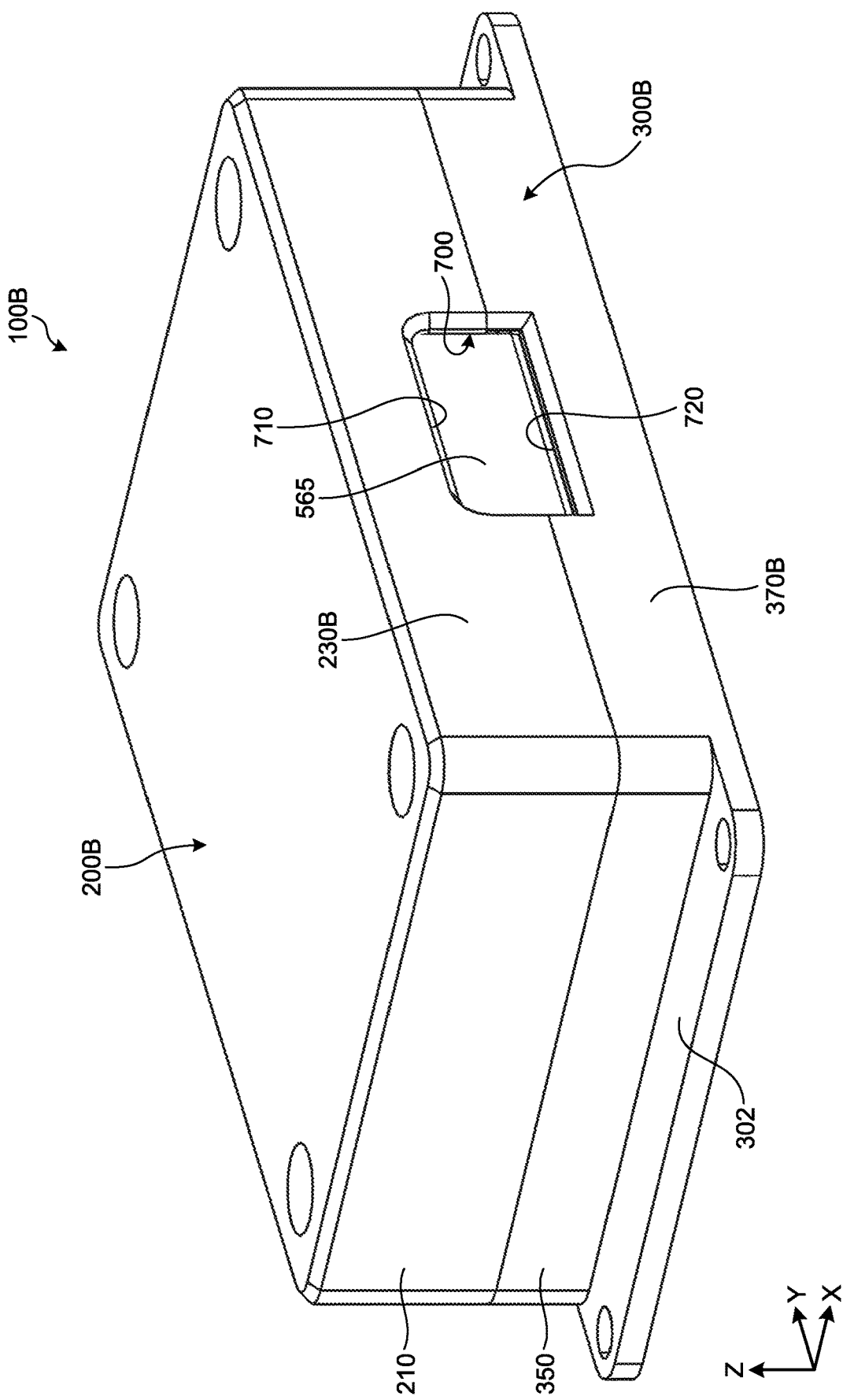
FIG. 11 is an exemplary and schematic perspective view of an electronic apparatus according to a third embodiment, which is viewed obliquely from above.
Figure 12:
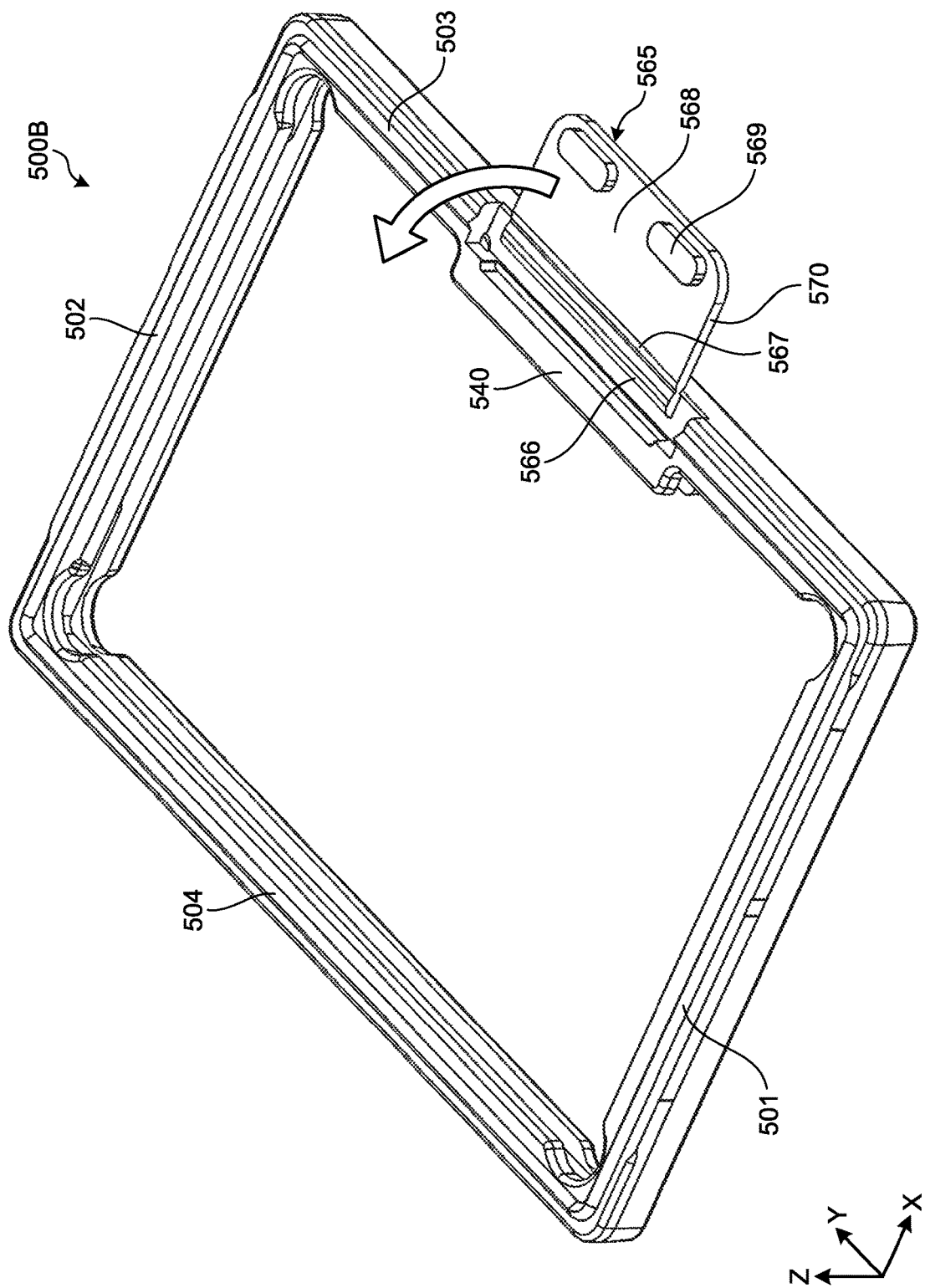
FIG. 12 is an exemplary and schematic perspective view illustrating an integrally molded component according to the third embodiment.
Figure 13:
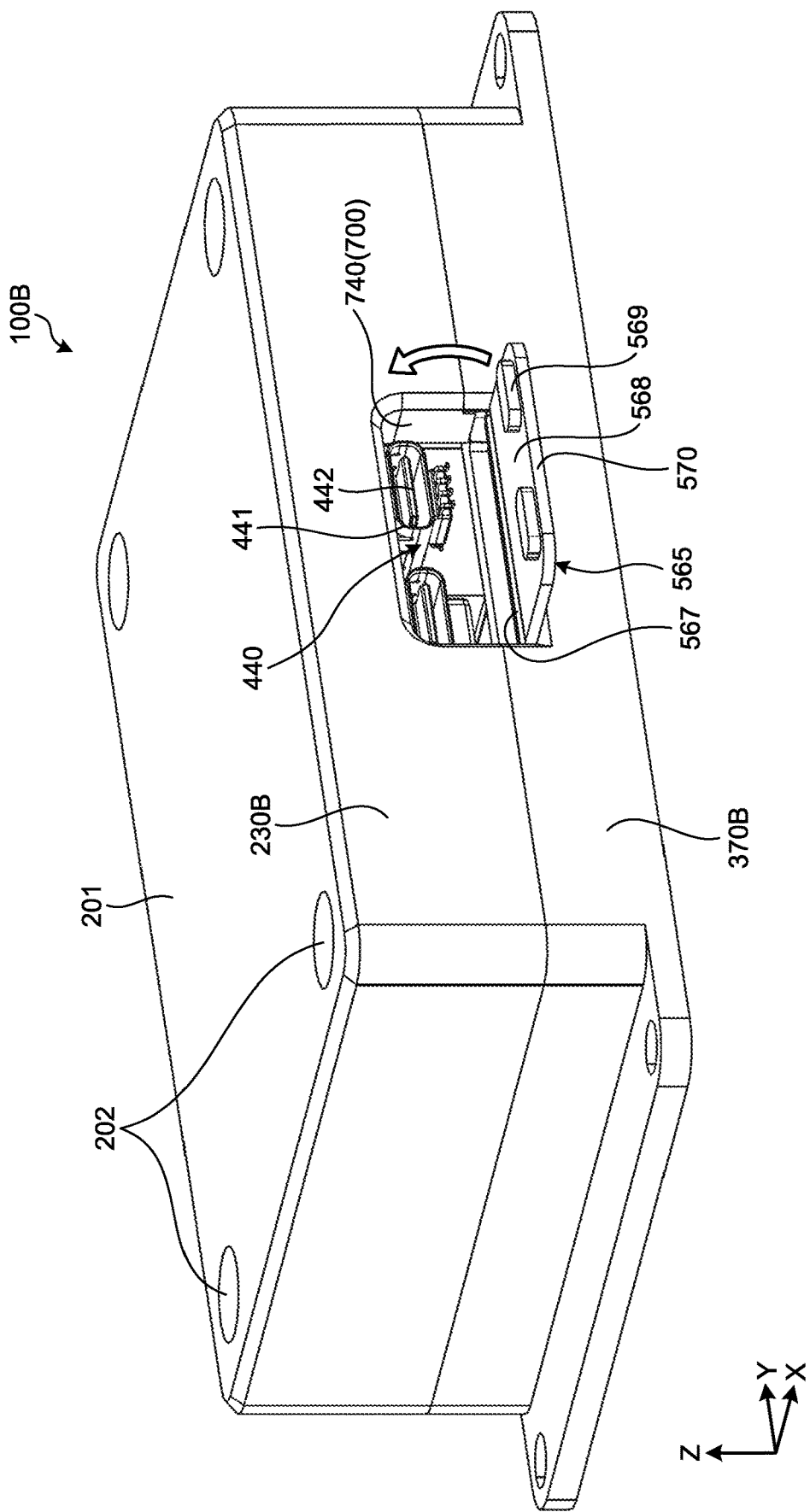
FIG. 13 is an exemplary and schematic perspective view illustrating a state where a first cover member illustrated in FIG. 11 is opened.

FIG. 11 is a perspective view of the electronic apparatus 100B according to the third embodiment, which is viewed obliquely from above. FIG. 12 is a perspective view illustrating an integrally molded component 500B according to the third embodiment. FIG. 13 is a perspective view illustrating a state where a first cover member 565 illustrated in FIG. 11 is opened.

As illustrated in FIGS. 11 and 13, the electronic apparatus 100B according to this embodiment is provided with a rectangular second opening 700 in the sidewall, for example, on the forward side in the X-direction. Specifically, the second opening 700 is formed by combining, in the Z-direction, an upper opening 710 provided in a third sidewall portion 230B of a first casing 200B with a lower opening 720 provided in a seventh sidewall portion 370B of a second casing 300B. Here, in FIG. 11, the second opening 700 is in a state closed by, for example, a first cover member 565.

As illustrated in FIG. 12, the integrally molded component 500B according to this embodiment is formed, for example, in a rectangular shape (loop shape) in a plan view. Specifically, the integrally molded component 500B is formed in a rectangular shape, by a first side 501 and a second side 502, which are a pair of short sides arranged with a space therebetween in the Y-direction and extending in the X-direction, and a third side 503 and a fourth side 504, which are a pair of long sides arranged with a space therebetween in the X-direction and extending in the Y-direction. In this embodiment, the first cover member 565 is integrally provided on the third side 503. The first cover member 565 includes, for example, a joint portion 566 integrally coupled with the third side 503, a hinge portion 567 provided adjacent to the forward side in the X-direction of the joint portion 566, and a main portion 568 provided adjacent to the forward side in the X-direction of the hinge portion 567.

The main portion 568 is a flat plate set in a thickness the same as that of the joint portion 566. The hinge portion 567 is formed by a thin portion locally smaller in thickness than the main portion 568 and the joint portion 566, and extends in the Y-direction. Accordingly, the main portion 568 is configured to be bent from the hinge portion 567 in the arrow direction. Further, the main portion 568 is provided with two protrusions 569, and the inner peripheral side (on the backward side in the X-direction) of the joint portion 566 at the third side 503 is integrally provided with a protruding portion 540 extending in the Y-direction. Further, as illustrated in FIG. 13, in a state where the first cover member 565 is opened, second external connection connectors 440 are exposed from the second opening 700. Each of the second external connection connectors 440 includes a cylindrical portion 441 and terminals 442 provided inside the cylindrical portion 441. The cylindrical portion 441 has a shape, for example, to allow one of the protrusions 569 of the first cover member 565 to be put therein. Here, the first cover member 565 is an example of a cover member.

Next, an explanation will be given of the opening and closing operations of the first cover member 565.

First, as illustrated in FIG. 13, in a state where the first cover member 565 is opened, the main portion 568 is bent from the hinge portion 567, and the second external connection connectors 440 are exposed from the second opening 700. Then, when the main portion 568 is bent in the arrow direction illustrated in FIG. 13, the outer peripheral edge 570 of the first cover member 565 is fitted to the edge 740 of the second opening 700 to cover the second opening 700, as illustrated in FIG. 12, for example, and the protrusions 569 of the first cover member 565 illustrated in FIG. 13 are put in the cylindrical portions 441 to cover the terminals 442.

As described above, the first casing 200B and the second casing 300B are provided with the second opening 700. The integrally molded component 500B includes the first cover member 565 (cover member) configured to be fitted to the edge 740 of the second opening 700 to cover the second opening 700. Accordingly, for example, there is no need to additionally provide a cover member, and thus the number of components can be reduced. Further, the first cover member 565 is integrated with the integrally molded component 500B, and thus also the first cover member 565 is made of an elastomer and is elastic. Accordingly, for example, the first cover member 565 can be easily fitted to the edge 740 of the second opening 700.

Fourth Embodiment

Next, an explanation will be given of an electronic apparatus 100C according to a fourth embodiment.

Figure 14:
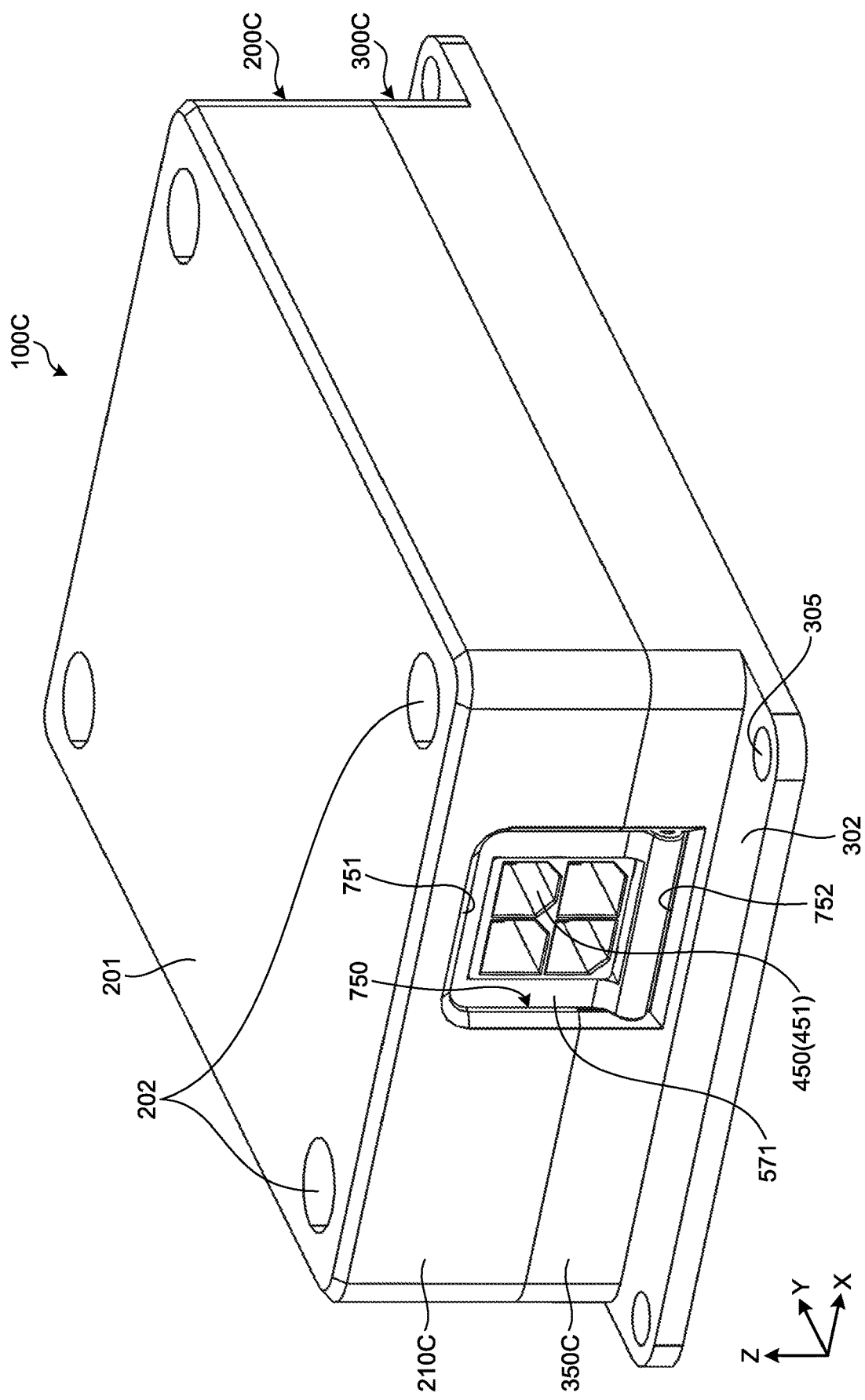
FIG. 14 is an exemplary and schematic perspective view of an electronic apparatus according to a fourth embodiment, which is viewed obliquely from above.
Figure 15:
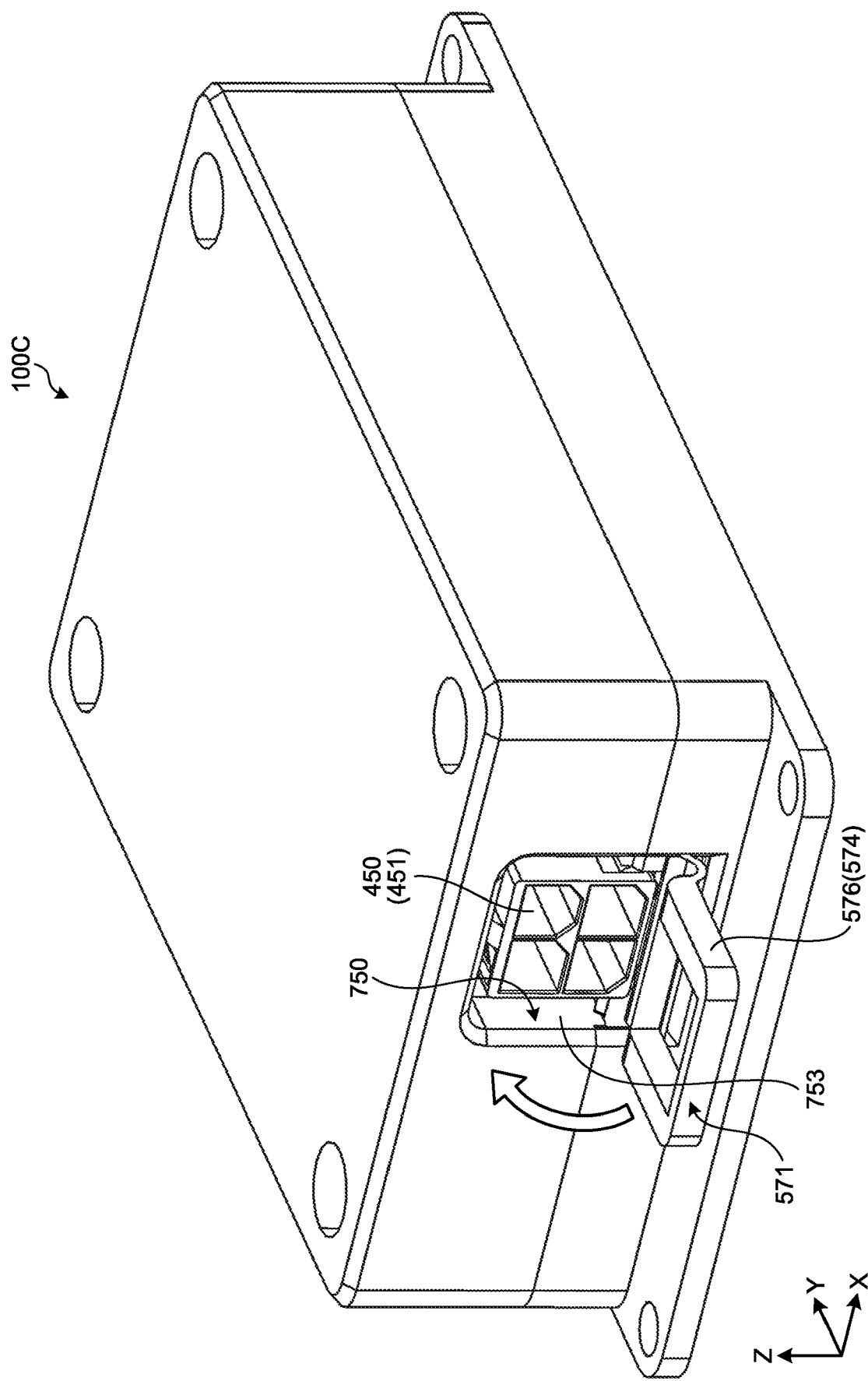
FIG. 15 is an exemplary and schematic perspective view illustrating a state where a second cover member illustrated in FIG. 14 is opened.
Figure 16:
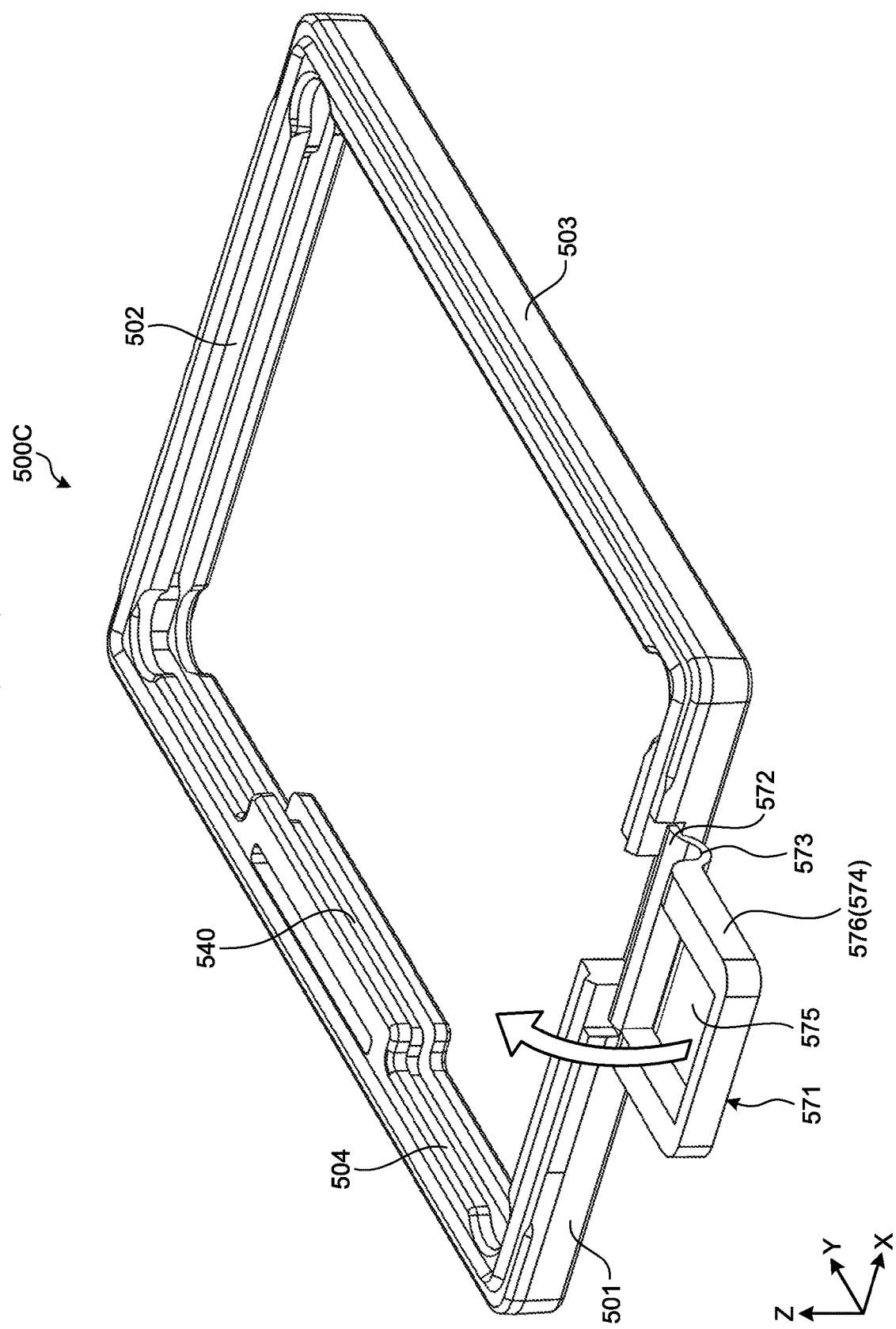
FIG. 16 is an exemplary and schematic perspective view illustrating an integrally molded component according to the fourth embodiment.

FIG. 14 is a perspective view of the electronic apparatus 100C according to the fourth embodiment, which is viewed obliquely from above. FIG. 15 is a perspective view illustrating a state where a second cover member 571 illustrated in FIG. 14 is opened. FIG. 16 is a perspective view illustrating an integrally molded component 500C according to the fourth embodiment.

As illustrated in FIGS. 14 and 15, the electronic apparatus 100C according to this embodiment is provided with a rectangular second opening 750 in the sidewall, for example, on the backward side in the Y-direction. Specifically, the second opening 750 is formed by combining, in the Z-direction, an upper opening 751 provided in a first sidewall portion 210C of a first casing 200C with a lower opening 752 provided in a fifth sidewall portion 350C of a second casing 300C. Here, in FIG. 14, the second opening 750 is in a state closed by a second cover member 571.

As illustrated in FIG. 16, the integrally molded component 500C according to this embodiment is formed, for example, in a rectangular shape (loop shape) in a plan view, which includes a first side 501, a second side 502, a third side 503, and a fourth side 504. In this embodiment, for example, the second cover member 571 is integrally provided on the first side 501. The second cover member 571 includes a joint portion 572 integrally coupled with the first side 501, a hinge portion 573 provided adjacent to the backward side in the Y-direction of the joint portion 572, and a main portion 574 provided adjacent to the backward side in the Y-direction of the hinge portion 573. The hinge portion 573 is formed by, for example, a thin portion smaller in thickness than the main portion 574, and extends in the X-direction. Accordingly, the main portion 574 is configured to be bent from the hinge portion 573 in the arrow direction. The main portion 574 has a U-shape, and is provided with an opening 575 on the inner peripheral side. Further, as illustrated in FIG. 15, in a state where the second cover member 571 is opened, a third external connection connector 450 is exposed from the second opening 750. The third external connection connector 450 includes, for example, shells 451 and terminals (not illustrated) provided inside the respective shells 451. Here, the second cover member 571 is an example of a cover member. The third external connection connector 450 has a configuration in which terminals (not illustrated) extend through respective shells 451 (casing) made of a synthetic resin. As the terminals and the shells 451 have been processed by insert molding, the third external connection connector 450 is provided with its necessary waterproof property.

Next, an explanation will be given of the opening and closing operations of the second cover member 571.

First, as illustrated in FIG. 15, in a state where the second cover member 571 is opened, the main portion 574 is bent from the hinge portion 573, and the third external connection connector 450 is exposed from the second opening 750. Then, when the main portion 574 is bent in the arrow direction illustrated in FIG. 15, the outer peripheral edge 576 of the main portion 574 is fitted to the edge 753 of the second opening 750 to cover the second opening 750, as illustrated in FIG. 14.

As described above, the first casing 200C and the second casing 300C are provided with, for example, the second opening 750. The integrally molded component 500C includes the second cover member 571 (cover member) configured to be fitted to the edge 753 of the second opening 750 to cover the second opening 750. Accordingly, there is no need to additionally provide a cover member, and thus the number of components can be reduced. Further, for example, even in a state where the second cover member 571 is fitted to the edge 753 of the second opening 750, the third external connection connector 450 is exposed from the opening 575 of the main portion 574 of the second cover member 571, and the terminal provided on an electric component can be electrically connected to one of the terminals of the third external connection connector 450.

Fifth Embodiment

Next, an explanation will be given of an electronic apparatus 100D according to a fifth embodiment.

Figure 17:
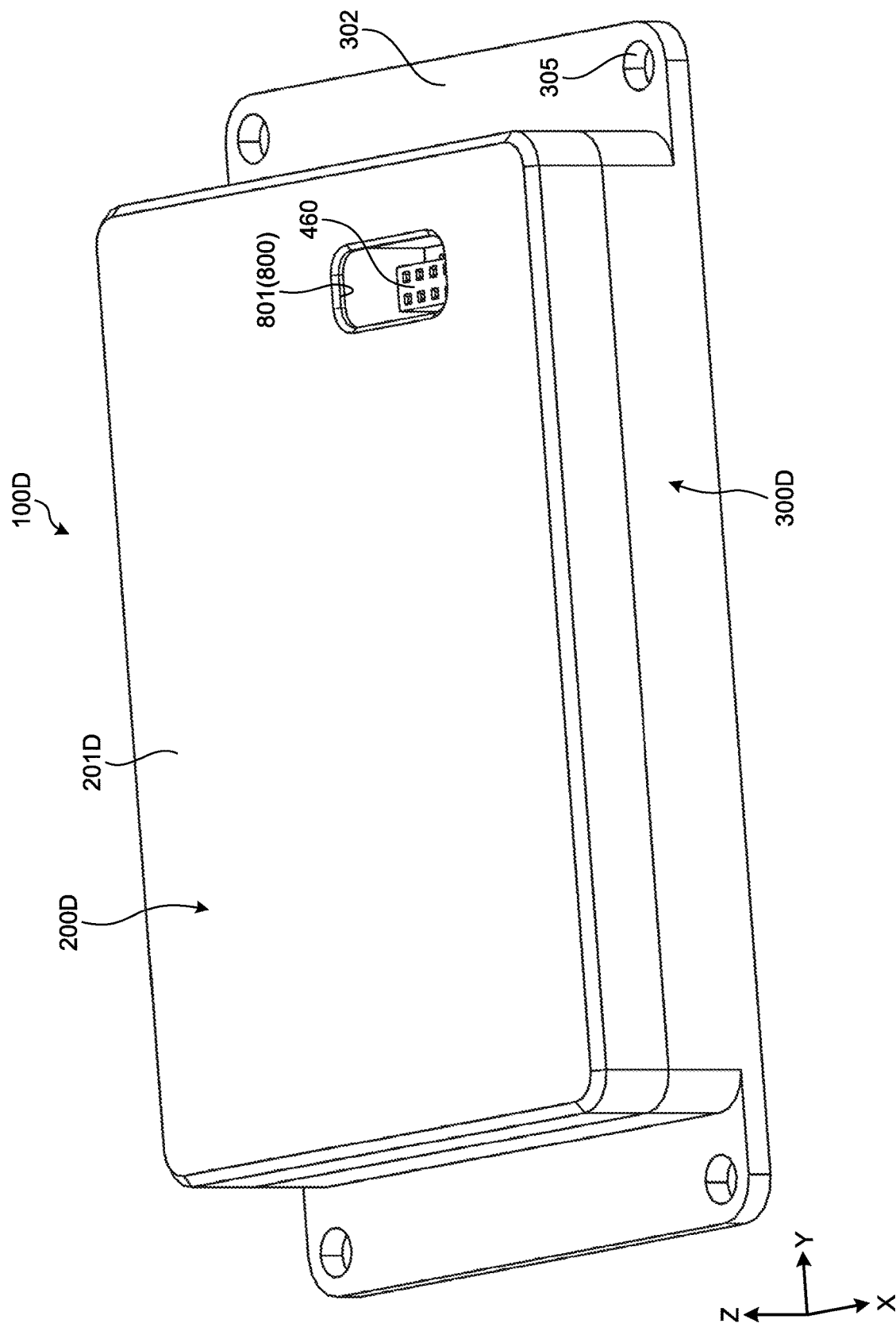
FIG. 17 is an exemplary and schematic perspective view of an electronic apparatus according to a fifth embodiment, which is viewed obliquely from above.
Figure 18:
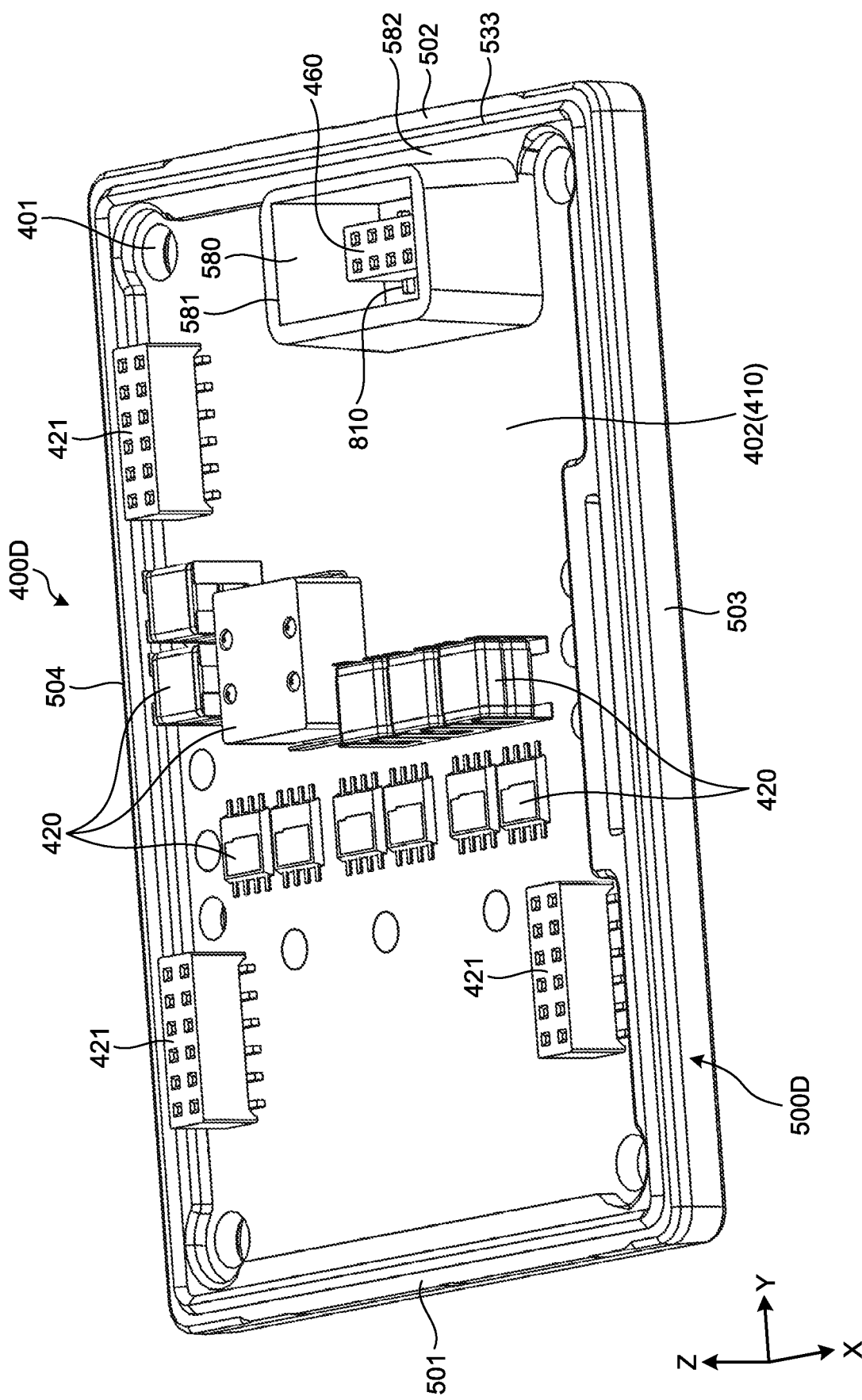
FIG. 18 is an exemplary and schematic perspective view illustrating a sub-assembly according to the fifth embodiment.
Figure 19:
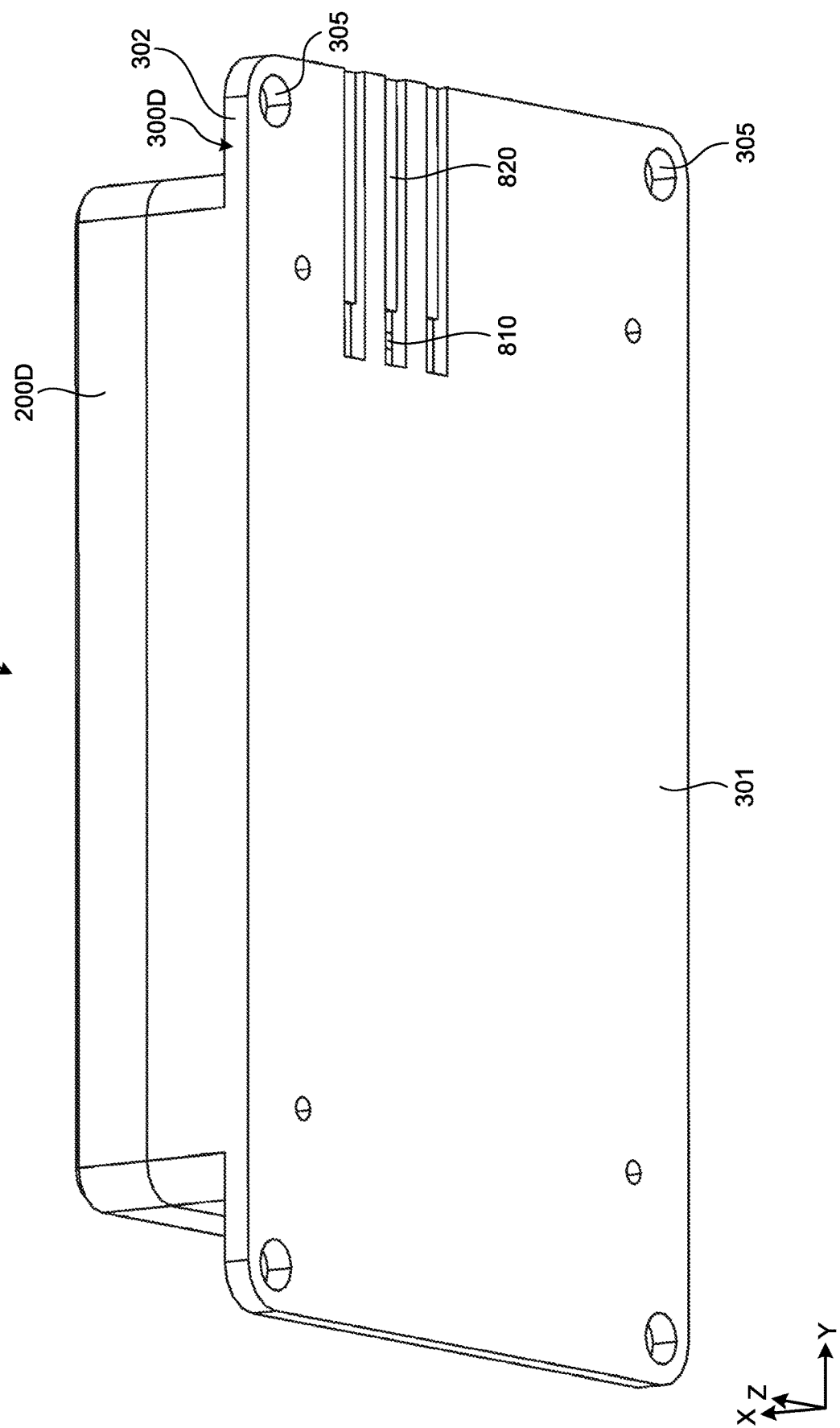
FIG. 19 is an exemplary and schematic perspective view of the electronic apparatus according to the fifth embodiment, which is viewed obliquely from below.

FIG. 17 is a perspective view of the electronic apparatus 100D according to the fifth embodiment, which is viewed obliquely from above. FIG. 18 is a perspective view illustrating a sub-assembly 400D according to the fifth embodiment. FIG. 19 is a perspective view of the electronic apparatus 100D according to the fifth embodiment, which is viewed obliquely from below.

As illustrated in FIGS. 17 and 18, the electronic apparatus 100D according to this embodiment includes, for example, a first casing 200D, a second casing 300D, and a sub-assembly 400D.

The first casing 200D includes a top wall portion 201D provided with, for example, a third opening 800 having a rectangular edge 801. Further, electronic components 420, connectors 421, and a fourth external connection connector 460 are mounted on a first face 402 of a board 410. The fourth external connection connector 460 is surrounded by a cylindrical wall 580 extending forward in the Z-direction from the first face 402 of the board 410. The cylindrical wall 580 is integrally connected to a second side 502 through a joint portion 582. The cylindrical wall 580 is formed in a rectangular shape when viewed in the Z-direction. Further, although not illustrated, the upper end 581 of the cylindrical wall 580 is in contact with the lower surface of the top wall portion 201D. Here, even when water infiltrates into the inner peripheral side of the cylindrical wall 580, the water is prevented from flowing to the electronic components 420 positioned outside the cylindrical wall 580.

Specifically, as illustrated in FIG. 19, the second casing 300D includes a bottom wall portion 301 provided with, for example, circular drain holes 810 extending therethrough in the Z-direction and drain grooves 820 extending thereon in the Y-direction. The drain grooves 820 consist of three grooves formed at intervals in the X-direction on the lower surface of the bottom wall portion 301, and the drain holes 810 consist of three holes communicating with the respective drain grooves 820. Here, the drain holes 810 are positioned on the inner peripheral side of the cylindrical wall 580. Further, the lower surface of the bottom wall portion 301 of the second casing 300D is in contact with a mounting counterpart member (not illustrated) to which the electronic apparatus 100D is secured. Accordingly, drain flow passages rectangular in section are formed by the drain grooves 820 and the mounting counterpart member.

As described above, the fourth external connection connector 460 is surrounded by the cylindrical wall 580. The bottom wall portion 301 of the second casing 300D is provided with the drain holes 810 and the drain grooves 820 communicating with the drain holes 810. Accordingly, for example, even when water infiltrates into the inner peripheral side of the cylindrical wall 580, the water is discharged through the drain holes 810 and the drain grooves 820, and so the water is prevented from staying on the inner peripheral side of the cylindrical wall 580.

While embodiments of the present invention have been described above, these embodiments have been presented as mere examples, and not intended to limit the scope of the invention. The embodiments described above may be implemented in a variety of other forms, and may be provided with various omissions, substitutions, combinations, and changes, without departing from the spirit of the invention. The embodiments described above fall within the scope and spirit of the invention, and fall within the scope of the invention recited in the accompanying claims and their equivalents. The present invention may be embodied by configurations other than those disclosed in the embodiments described above, and can provide various effects (including derivative effects) obtained by the basic constitution (technical features). Further, the specifications of each constituent element (structure, type, direction, shape, size, length, width, thickness, height, number, arrangement, position, material, and/or the like) may be implemented along with suitable changes.

For example, in an embodiment, the integrally molded component 500 is provided with both of the first protruding portion 533 and the second protruding portion 535, but may be provided only with the first protruding portion 533 or only with the second protruding portion 535. Further, in an embodiment, electronic components 420 are mounted on both of the first face 402 and the second face 403 of the board 410, but electronic components 420 may be mounted only on the first face 402 or only on the second face 403. Further, in each of the third and fourth embodiments, the second opening 700 or 750 is provided by both of the first casing 200B or 200C and the second casing 300B or 300C, but may be provided only by the first casing 200B or 200C or only by the second casing 300B or 300C. Further, in an embodiment, the sectional shape of each of the first protruding portion 533 and the second protruding portion 535 is exemplified by a triangular shape, but may be formed of an elliptical shape or an arc shape.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a first casing;
   a second casing; and
   a sub-assembly including a board, a component, and an integrally molded component integrated with the board, wherein the board is positioned in a cavity between the first casing and the second casing, spaced away from a top wall portion of the first casing and a bottom wall portion of the second casing, and includes a first face, a second face opposite to the first face, and an outer rim between the first face and the second face, the component is mounted on at least one of the first face and the second face, and the integrally molded component includes a first part in contact with the first face, a second part in contact with the second face, a protruding part comprising a first and a second protruding portions, a third part connecting the protruding part, the first part and the second part to each other, and is in a state integrated with the board while the first and second parts sandwiching the board, and the first and second protruding portions sandwiched between the first casing and the second casing; and
   the first casing includes a first perimeter area having a loop shape, the second casing includes a second perimeter area having a loop shape extending along the first perimeter area, and the third part has a rectangular loop shape extending along the first perimeter area, and is sandwiched between the first perimeter area and the second perimeter area over an entire circumference of this loop shape.

2. The electronic apparatus according to claim 1, wherein the component is mounted on the board by solder, and the elastomer has a melting temperature lower than a melting temperature of the solder.

3. The electronic apparatus according to claim 1, wherein the component is mounted on the board by solder, and the elastomer has a melting temperature lower than a melting temperature of the solder.

4. The electronic apparatus according to claim 1, wherein the component is mounted on the board by solder, and the elastomer has a melting temperature lower than a melting temperature of the solder.

5. The electronic apparatus according to claim 1, wherein the integrally molded component includes at least one of a first protruding portion, which has a loop shape extending along the first perimeter area and provides a contact region having a loop shape with respect to the first perimeter area, and a second protruding portion, which has a loop shape extending along the second perimeter area and provides a contact region having a loop shape with respect to the second perimeter area.

6. The electronic apparatus according to claim 5, wherein the component is mounted on the board by solder, and the elastomer has a melting temperature lower than a melting temperature of the solder.

* * * * *